United States Patent [19]
McAlpine

[11] Patent Number: 6,167,491
[45] Date of Patent: Dec. 26, 2000

[54] HIGH PERFORMANCE DIGITAL ELECTRONIC SYSTEM ARCHITECTURE AND MEMORY CIRCUIT THEREFOR

[76] Inventor: Gary L. McAlpine, 11555 SW. 155th Ter., Beaverton, Oreg. 97007

[21] Appl. No.: 09/035,640

[22] Filed: Mar. 5, 1998

Related U.S. Application Data

[62] Division of application No. 08/812,376, Mar. 5, 1997, Pat. No. 5,802,580, which is a continuation of application No. 08/300,421, Sep. 1, 1994, abandoned.

[51] Int. Cl.[7] ...................................................... G06F 12/02
[52] U.S. Cl. ............................ 711/149; 711/143; 711/146
[58] Field of Search .................................... 711/131, 149, 711/168, 143, 146

[56] References Cited

U.S. PATENT DOCUMENTS

| | | | |
|---|---|---|---|
| 5,375,089 | 12/1994 | Lo | 365/189.04 |
| 5,440,523 | 8/1995 | Joffe | 365/230.05 |

Primary Examiner—Hiep T. Nguyen

[57] ABSTRACT

A digital electronic system architecture having one or more system components and a memory coupled to selected system components, the memory selectively storing and communicating data among the coupled components. The digital electronic system preferably also has a transaction control bus, coupled to each of the selected system components and to the memory, for communicating command and control signals among the components and memory. A memory circuit is provided that has a plurality of ports, each of the ports (i) having an input terminal and an output terminal that transfer data independently of one another, (ii) operating independently of one another and (iii) being coupled respectively to one of the other system components for data communication therewith. A read interface for a memory array is provided that has a queue for receiving data read from a row of the array and a selection circuit for placing in the queue a contiguous block of the read data, the size of the block and its placement being selectable. The read interface preferably comprises a plurality of queues, and the selection circuit preferably is adapted to place independently selectable blocks of the read data in independently selectable positions in selected queues. A write interface for a memory array is also provided that has a queue for receiving data to be written to the array and a selection circuit for placing in the array a contiguous block of received data, the size of the block and its placement being selectable. The write interface preferably comprises a plurality of queues, and the selection circuit preferably is adapted to place independently selectable data received from selected queues in independently selectable positions in the memory array.

20 Claims, 17 Drawing Sheets

HIGH PERFORMANCE DIGITAL ELECTRONIC SYSTEM ARCHITECTURE AND MEMORY CIRCUIT THEREFOR

This application is a division of application Ser. No. 08/812,376, filed on Mar. 5, 1997, now U.S. Pat. No. 5,802,580 which was a continuation of application Ser. No. 08/300,421, filed on Sep. 1, 1994 now abandoned.

BACKGROUND OF THE INVENTION

This invention relates to digital electronic system architectures and circuits therefor, particularly to such architectures and circuits for use in applications requiring high performance memory access and data transfer.

Modern digital electronic systems are called upon to provide ever higher system performance, including higher speed data throughput, higher data bandwidth and lower system latencies. Higher system performance is driven by new applications, as well as advances in current applications. For example, the implementation of high definition television ("HDTV") depends critically on increasing digital system performance so as to achieve fundamental improvements in the quality of the large picture size of HDTV, relative to the current television standard. At the same time, advances in personal computers also require increases in system performance to accommodate developments such as parallel, superscalar and other advanced processing techniques.

Increases in system performance ideally keep pace with increases in the performance of components employed in the systems so as to take full advantage of the components' capabilities. In practice, however, system performance lags component performance, being burdened by adherence to conventional architectures in the design of digital electronic systems.

Conventional system architectures generally combine a microprocessor, a main memory, and one or more other system components, such as other microprocessors and input/output devices. These architectures generally rely on a separate data communication mechanism that interconnects, and communicates data among, the system components. In particular, these architectures provide for interconnecting components through the data communication mechanism so as to share the main memory among each of the microprocessor and selected other system components.

These conventional architectures typically implement the data communication mechanism using either a conventional multi-drop data bus or a multi-port hardware switch. In multi-drop bus implementations, data communication is time-multiplexed among the system components coupled to the bus. In multi-port hardware switch implementations, each of the system components is coupled respectively to one of the switch ports, and data communication between any two components. In addition, these architectures typically implement main memory using a plurality of conventional discrete dynamic random access memory ("DRAM") devices, together with associated access circuitry.

These conventional architectures, while suitable for many applications, tend to be inadequate for high performance applications. In particular, conventional architectures are inadequate for applications requiring one or more of high system throughput, high system bandwidth or low system latencies. Conventional architectures have nevertheless been employed. To do so, the architectures' performance shortfalls have typically been addressed using custom engineering solutions that adhere to the fundamental confines of the architecture. For example, to provide enhanced video capabilities, personal computers have employed a video controller connected to the microprocessor through a multi-drop data bus, while using a bank of memory separate from main memory, this memory bank being dedicated to video and typically implemented using video random access memory ("VRAM") devices.

These custom engineering solutions have significant limitations, including that they inherently address only the performance of individual components or features within the system, rather than the performance of the system as a whole. Accordingly, these solutions generally improve overall system performance to only a limited degree, if at all. Moreover, these solutions become increasingly more difficult to implement as performance demands increase, that difficulty increasing implementation expense. Accordingly, conventional architectures are increasingly inadequate, if viable at all, for high performance applications. The architectures' performance shortfalls are more acute while the architecture-bound solutions suffer from ever greater limitations.

Conventional architectures' performance shortfalls stem, in particular, from constraints on the cooperation of system components. In turn, that cooperation depends in large part on data communication and main memory sharing among system components.

The implementation of the data communication mechanism is particularly associated with conventional architectures' performance shortfalls. When the architectures' data communication mechanism is implemented using a conventional multidrop data bus, for example, system performance is limited to the bandwidth and throughput of the bus. Bus bandwidth and throughput is subject both to the loading associated with interfacing the bus to system components and to the bus' physical characteristics, e.g., the length of the bus lines. In addition, because buses time-multiplex data communications, system performance is limited by associated latency in access to system data communications, a limitation that compounds with increases in either or both the number of components seeking to communicate and the size of each communication. In practice, system performance degrades as communications between any two components are impaired for any reason.

Implementing the architectures' data communication mechanism using a conventional multi-port hardware switch, rather than a multi-drop bus, can increase system performance. The increase results from the switch's typically higher throughput and bandwidth. However, these switches tend not only to be expensive, but also to introduce other significant problems in system performance. For example, the switches are not well suited either for networks and other applications requiring data communications in variable block sizes, or for HDTV and other applications requiring random accessibility of data in high speed operations. In addition, these switches typically do not provide for communication of control signals among components. Accordingly, these switches undesirably preclude each component's monitoring, e.g., "snooping", of the other components' memory activities, snooping generally being important to memory protection and cache coherency. Moreover, these switches also tend to substantially preclude the communication of data from one component to a plurality of other components, e.g., multi-cast data communications.

While conventional architectures' performance shortfalls are associated with the implementation of the data communication mechanism, the shortfalls are also associated with implementing a shared main memory. Reliance on conventional discrete DRAM devices to implement main memory significantly limits system performance, for example, as to system bandwidth and throughput. Conventional discrete DRAM devices have bandwidths that are significantly less than those of current microprocessors, as well as those of increasing numbers of other high performance components.

Several approaches have been taken toward improving main memory performance. One approach is to replace conventional discrete DRAM devices with conventional discrete static random access memory ("SRAM") devices in implementing main memory, so as to take advantage of SRAM devices' substantially higher bandwidths. However, using these SRAM devices generally introduces undesirable costs. Because these SRAM devices are approximately four times more expensive per unit memory size than the DRAM devices and because memory size generally is large and is likely to grow, e.g., full feature HDTV sets are expected to require at least 32 megabytes while next generation personal computers generally are expected to require at least 16 megabytes, the cost of implementing main memory using conventional discrete SRAM simply is antithetical to the economics of main memory implementation.

Other conventional approaches to improving main memory performance focus on improving the bandwidth and throughput of discrete DRAM devices. These approaches include incorporating SRAM memory as cache in discrete DRAM devices; bundling memory in propriety subsystems having internal data bussing, caching and protocols; employing multiple internal memory arrays; and employing alternate input/output modes. While each of these approaches tends to achieve some improvement in the performance of DRAM devices, each also tends to be subject to undesirable limitations. First, incorporating cache in the DRAM devices improves performance only to the extent cache hits occur with substantial regularity. However, cache hits tend to vanish under various circumstances, particularly in applications having main memory rapidly accessed by several components. Second, having multiple internal memory arrays tends to improve performance only if successive memory accesses address different arrays. In addition, to accommodate successive accesses of a single array, additional circuitry must be provided that compensates for the associated timing differences in the device's output of data. Third, alternate output modes, which include page mode, static column mode, and nibble mode, allow faster access to data by outputting the data in bursts, but generally at the undesirable expense of reducing random accessibility; that is, the modes at best provide random access only within the burst.

The above, as well as other, conventional approaches to improving main memory performance also have the significant limitation of being directed narrowly at improving the memory's bandwidth and throughput. In doing so, the conventional approaches generally seek specifically to close the bandwidth gaps between main memory and microprocessors. Accordingly, the conventional approaches are not directed at improving cooperation among the system components so as to improve system performance. In particular, these approaches are not directed at improving communication of data among the system components or specifically at improving the sharing of main memory among a plurality of system components, all of which components may have bandwidths comparable to high performance microprocessors.

Accordingly, there is a need for an improved digital electronic system architecture and, in particular, an architecture that permits implementation of high performance digital electronic systems by improving data communication and main memory sharing among the system components. There is also a need for an improved memory circuit and, particularly, for a memory circuit that permits implementation of high performance digital electronic systems.

SUMMARY OF THE INVENTION

The present invention meets the aforementioned needs and overcomes the aforementioned limitations by providing a digital electronic system architecture having one or more system components and a memory coupled to selected system components, the memory selectively storing and communicating data among the coupled components. The digital electronic system preferably also has a transaction control bus, coupled to each of the selected system components and to the memory, for communicating command and control signals among the components and memory. The invention also provides a memory circuit having a plurality of ports, each of the ports (i) having an input terminal and an output terminal that transfer data independently of one another, (ii) operating independently of one another and (iii) being coupled respectively to one of the other system components for data communication therewith. The present invention also provides a read interface for a memory array, the interface having a queue for receiving data read from a row of the array and a selection circuit for placing in the queue a contiguous block of the read data, the size of the block and its placement being selectable. The read interface preferably comprises a plurality of queues, and the selection circuit preferably is adapted to place independently selectable blocks of the read data in independently selectable positions in selected queues. The present invention also provides a write interface for a memory array, the interface having a queue for receiving data to be written to the array and a selection circuit for placing in the array a contiguous block of received data, the size of the block and its placement being selectable. The write interface preferably comprises a plurality of queues, and the selection circuit preferably is adapted to place independently selectable data received from selected queues in independently selectable positions in the memory array.

Therefore, it is a principal object of the present invention to provide a novel and improved digital electronic system architecture.

It is another principal object of the present invention to provide a novel and improved digital electronic memory circuit.

It is another object of the present invention to provide a digital electronic system architecture having improved memory access and data transfer performance.

It is a further object of the present invention to provide a digital electronic system architecture wherein main memory performs system data routing.

It is yet another object of the present invention to provide a digital electronic system architecture wherein main memory is shared by a plurality of system components, the main memory being randomly accessible by each of the components through independent data ports of the main memory.

It is yet a further object of the present invention to provide a digital electronic system architecture that can transfer data between main memory and a plurality of other system components simultaneously.

It is another object of the present invention to provide a digital electronic system architecture wherein any of a plurality of system components may transmit command and control signals to one or more other system components simultaneously.

It is a further object of the present invention to provide a digital electronic system architecture employing transaction-based command and control among the system components so as to enhance overall system performance.

It is yet another object of the present invention to provide a novel digital electronic system architecture that is compatible with components and techniques employed in conventional digital electronic system architectures.

It is yet a further object of the present invention to provide a digital electronic system architecture that consolidates virtually all system memory functions into a single system memory.

It is still a further object of the present invention to provide a digital electronic system architecture having a multi-port main memory that is scalable in capacity, bandwidth, word width and number of ports.

It is another object of the present invention to provide a novel and improved memory circuit with enhanced memory access and data transfer performance.

It is a further object of the present invention to provide a memory circuit that permits implementation, in a digital electronic system, of main memory having enhanced bandwidth, throughput and random accessibility in all data transfer modes.

It is yet another object of the present invention to provide a memory circuit having multiple data transfer ports capable of simultaneous and mutually independent data transfer.

It is yet a further object of the present invention to provide a memory circuit capable of supporting ports of selectable word width while providing substantially unrestricted random accessibility to the memory through all ports, in variable size blocks and in both read and write operations.

It is still another object of the present invention to provide a memory circuit that segregates control operations from access operations.

It is still a further object of the present invention to provide a memory circuit having a plurality of independent ports and capable of selectively sharing its bandwidth among a plurality of components coupled to respective ports.

It is another object of the present invention to enable broadcast of control information simultaneously with data transfers through dedicated ports.

It is a further object of the present invention to enable an order of magnitude increase in achievable main memory performance while maintaining a hardware model consistent with existing operating system software, i.e., wherein all data communications pass through main memory.

It is yet another object of the present invention to provide a discreet memory device with a configurable number of ports and port widths.

The foregoing and other objects, features and advantages of the invention will be more readily understood upon consideration of the following detailed description, taken in conjunction with the accompanying drawings.

DETAILED DESCRIPTION

Figure 1:
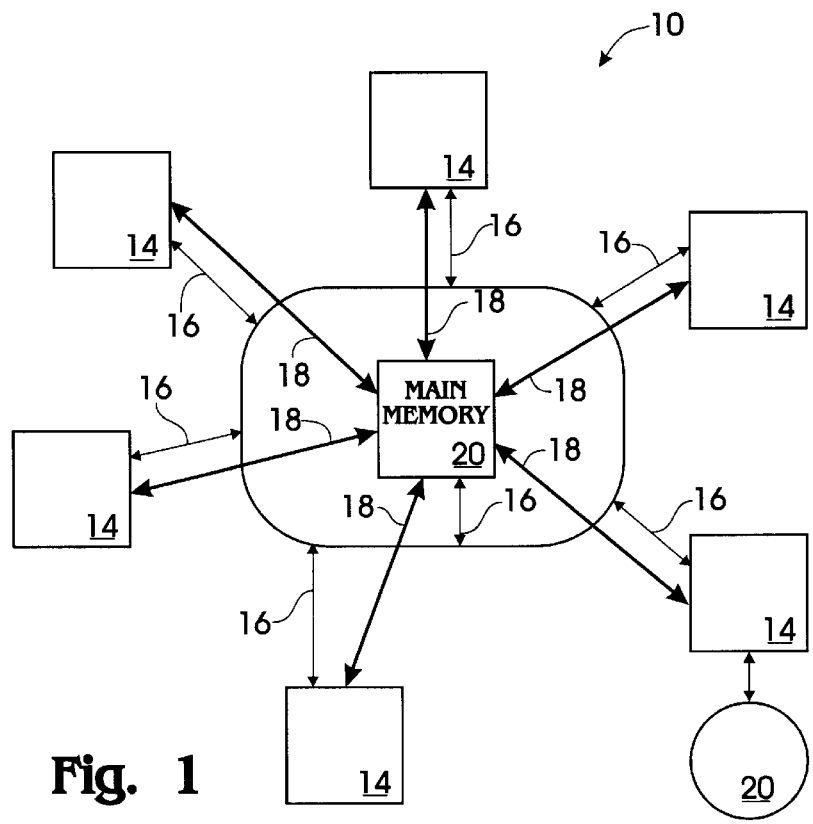
FIG. 1 shows a schematic representation of a generalized digital electronic circuit implemented using an architecture according to the present invention.

Referring to FIG. 1, a generalized digital electronic system 10 implemented using an architecture according to the present invention comprises a main memory 12, a plurality of other system components 14 and a control and address bus 16. The control and address bus 16 is common to the main memory 12 and the other system components 14, and is sometimes referred to herein as the transaction control bus. The main memory 12 has a plurality of ports 18, each port providing a mechanism for data communication between the main memory 12 and the respective system component 14 coupled to the main memory 12. The storage functions of the main memory 12 preferably are shared by each of the system components 14; that is, the main memory 14 preferably is randomly accessible by the system components 14 through the respective ports 18. The ports 18 preferably operate independently of each other, so as to facilitate data communication, including providing for effectively simultaneous data communication between main memory and any plurality of system components coupled thereto.

The other system components 14 include one or more microprocessors, mass storage devices, video controllers, input/output devices, network interfaces, or the like. One or more of these system components 14 may be coupled to one or more peripheral components 20.

Although the digital electronic system 10, as shown, does not include any conventional data bus or hardware switch, it is to be recognized that the system 10 may include such a data bus or switch. For example, the digital electronic system 10 may comprise a conventional multi-drop input/output bus to which mass storage and other peripheral components are coupled, the bus generally being coupled to the main memory 12 by an interposed controller. The important point is that the main memory 12, according to the digital electronic system architecture of the present invention, provides the primary mechanism for data communication among the system components 14 coupled thereto.

The transaction control bus 16 communicates command, control and address signals, but no data, among the system components 14. The transaction control bus 16 preferably comprises a system clock, signals combined to form transaction descriptors, and one or more control and arbitration signals coordinating accesses of, respectively, the main memory 12 and the transaction control bus 16. Each transaction descriptor preferably consumes a relatively small portion of the bus' bandwidth. Moreover, each transaction descriptor communicated over the bus 16 preferably is independent of the other communicated descriptors.

Each transaction descriptor preferably corresponds to a predefined transaction. To do so, each transaction descriptor preferably includes information identifying the type of transaction, e.g., load, write and read transactions for accesses of the main memory 12, as well as information identifying each participating system component 14, e.g., by the port 18 at which the participating component 14 is respectively coupled to the main memory 12.

The transaction control bus 16 preferably time multiplexes the communication of transaction descriptors thereover. In particular, each of the system components 14 competes for access to the bus 16 when transmitting transaction descriptors associated with accessing the main memory 12. Access to the transaction control bus 16 preferably is determined by a selected arbitration algorithm. Because system throughput is limited principally by time-multiplexed communication of transaction descriptors over the transaction control bus 16 and each such descriptor consumes a relatively small portion of the bus' bandwidth, the transaction control bus 16 provides for communication of descriptors at a relatively high rate. Moreover, because each descriptor can control the communication of a relatively large amount of data, the system's use of the bus 16 provides for a substantially enhanced system throughput of data.

Each transmission over the transaction control bus 16 by any of the main memory 12 or a system component 14 preferably is received by each of the other system components 14 and main memory 12, as the case may be. Having broadcast command and control communications, the system 10 supports conventional techniques and technologies including (i) snooping by each system component 14 of each of the other components' activities respecting the main memory 12, such as to maintain memory protection and cache coherency, where implemented, (ii) multi-cast data communication among the system components 14, and (iii) basic arbitration algorithms. More specifically, broadcast command and control communications supports use of basic memory protection and cache coherency algorithms, particularly because each system component 14 can monitor the transaction descriptors communicated by the other system components 14. Moreover, broadcast command and control communications makes practical the use of basic arbitration algorithms because arbitration need only coordinate accesses to the transaction control bus 16 for defined, relatively short transaction descriptors from a known number of sources.

Figure 2:
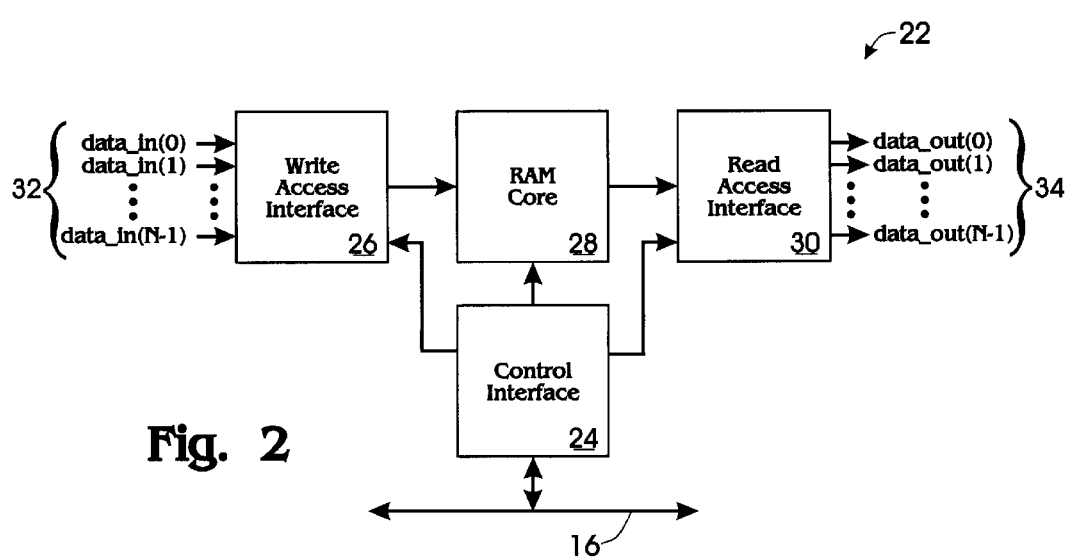
FIG. 2 shows a general block diagram of a memory circuit according to the present invention.

Referring to FIG. 2, a memory circuit 22, in accordance with the present invention, includes a control interface 24, a write access interface 26, a RAM core 28 and a read access interface 30. The control interface 24 is coupled to the transaction control bus 16, as well as to each of the write access interface 26, the RAM core 28 and the read access interface 30. The write access interface 26 is coupled to the RAM core 28 which, in turn, is coupled to the read access interface 30. The write access interface 26 has a plurality of data input terminals 32, while the read access interface 30 has a plurality of data output terminals 34. The input and output terminals 32 and 34 have a selected number, the number being designated herein by N.

It is to be recognized that the data input and output terminals 32 and 34 may be grouped to form a selected number of ports 18, the number being designated herein as P. The number of ports P is between 1 and N, each port being coupled respectively to one of the system components 14, as shown in FIG. 1. It is also to be recognized that the main memory 12 of the system architecture shown in FIG. 1 preferably is implemented using one or more memory circuits 22, the circuits 22 being organized to provide a selected word width for each of the ports 18 (word width is designated herein as W). In such implementation, each circuit 22 generally provides a slice of the word width, the slice being N/P bits wide.

In the memory circuit 22, the control interface 24, in response to signals received over the transaction control bus 16, controls each of the write access interface 26, the RAM core 28 and the read access interface 30. More specifically, the control interface 24 controls the routing of data into and out of the RAM core 28, as well as communication of data at the input and output terminals 32 and 34. The write access interface 26, under control of the control interface 24, provides for buffering, queuing and routing of data for storage in the RAM core 28, the data being communicated to the memory circuit 22 at one or more of the data input terminals 32. The read access interface 30, under control of the control interface 24, provides for routing, queuing and buffering of data stored in the RAM core 28 for communication at one or more of the data output terminals 34.

Figure 3:
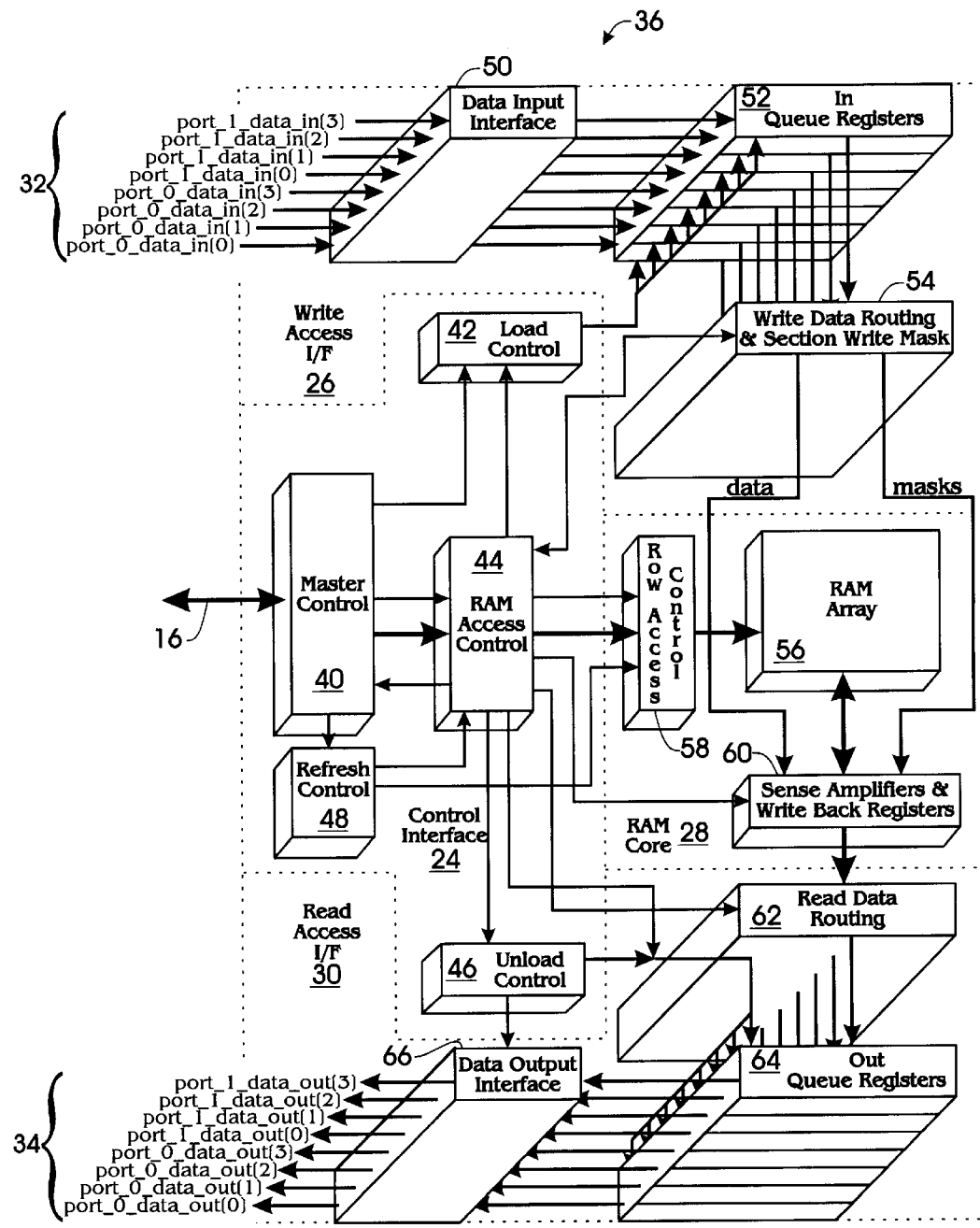
FIG. 3 shows a block diagram of a specific embodiment of the memory circuit of FIG. 2.

The memory circuit 36 shown in FIG. 3 is a specific embodiment of the memory circuit 22 shown generally in FIG. 2. In memory circuit 36, the control interface 24 comprises a master control 40, a load control 42, a RAM access control 44, and an unload control 46. The control interface 24, as shown, also comprises a refresh control 48. The refresh control 48 is employed when the RAM core 28 is implemented using dynamic random access memory ("DRAM"). In that case, the refresh control 48 provides, through the RAM access control 44, for refresh of the DRAM cells. Refresh circuits and procedures are known and, accordingly, are not described further herein. It is to be recognized that, if the RAM core is implemented using other than DRAM, the refresh control 48 may be omitted without departing from the principles of the invention. It is also to be recognized that, although the remainder of this disclosure is directed to memory circuits using DRAM, SRAM may be employed, subject only to modifications readily understood to those of ordinary skill in the art by reference to the disclosures hereof and to well known memory design techniques, without departing from the principles of the invention.

In memory circuit 36, the write access interface 26 comprises a data input interface 50, in queue registers 52 and a write data routing and section write mask circuit 54. In turn, the RAM core 28 comprises a RAM array 56, a row access control 58, and sense amplifiers and write back registers 60. Moreover, the read access interface 30 comprise a read data routing circuit 62, out queue registers 64 and a data output interface 66. The in and out queue registers 52 and 64 preferably are equal in number and in one-to-one relationship with the number of input and output terminals 32 and 34, respectively, such that the registers are N in number. The in and out queue registers 52 and 64 preferably have uniform bit depth, that depth being designated herein by Q. The write data routing and section write mask circuit 54 and the sense amplifiers and write back registers 60 are sometimes referred to herein as the routing/mask circuit 54 and the sense/write circuit 60, respectively.

Figure 4:
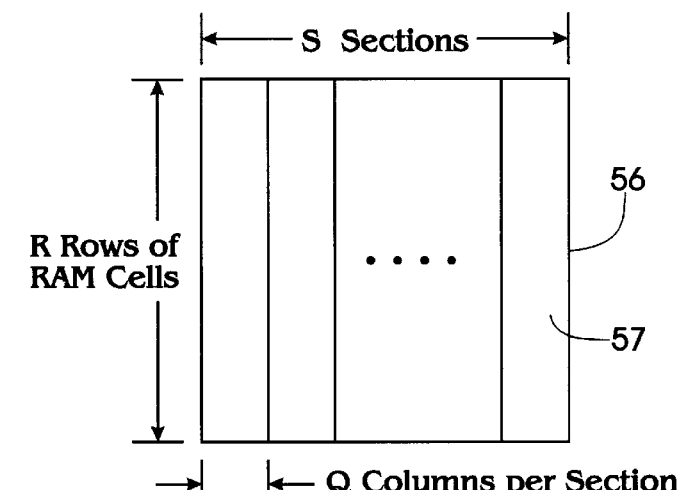
FIG. 4 shows a logical organization of a RAM array according to the present invention.

Turning to FIG. 4, the RAM array 56 preferably is a conventional array, physically organized as R rows and C columns. The RAM array's columns preferably are logically organized into S sections 57. Although the sections 57, as shown, lie end to end to form each row in the array 56, it is to be recognized that the sections 57 may have other logical organization, including being interleaved bit-by-bit, without departing from the principles of the invention.

The number of columns per section 57 in the array 56 preferably is uniform for all sections 57 and equals the bit depth Q of the in and out queue registers 52 and 64. The number S of sections 57 preferably is a power-of-two integer, and follows the formula S=C/Q. Having this logical organization provides for addressing the array's rows using $\log_2(R)$ bits, addressing the array's sections 57 using $\log_2(S)$ bits, and addressing the array's columns within an addressed section using $\log_2(Q)$ bits. It is to be recognized that, when the data input and output terminals 32 and 34 are N in number and are grouped to form a selected number P of ports 18, the circuit 36 generally provides a word slice N/P bits wide. In that case, when a transaction descriptor associated with a particular port is executed, N/P in or out queue registers 52 or 64 generally are implicated. Accordingly, the transaction descriptor generally addresses the RAM array 56 in groups of N/P sections 57. This logical organization, then, provides for accessing the RAM array 56 in one or more queue-sized sections 57 in any transaction, while being able to address each column within such section.

The RAM array 56 may be constructed using conventional SRAM or DRAM. Generally, the RAM array 56 may be any memory technology.

Referring again to FIG. 3, the control interface's master control 40 preferably has principal functions that include (i) providing configuration information for the memory circuit 36, including the number of ports 18 and associated grouping of elements of the circuit 36, (ii) receiving the external command and control signals carried over the transaction control bus 16 and, in response thereto, generating internal command and control signals, including an internal clock signal, and distributing the signals to the other elements of the circuit 36, and (iii) receiving internal command and control signals from the other elements of the circuit 36 and, in response thereto, generating external command and control signals for transmission over the transaction control bus 16.

The control interface's RAM access control 44, in response to internal signals received from the master control 40, generates internal command and control signals and distributes the signals to the appropriate elements of the circuit 36 in accordance with internal timing demands associated with performing each transaction. Among other principal functions so provided, the RAM access control 44 coordinates the flow of data in and out of the RAM core 28 and controls read and write timing. In addition, the RAM access control 44 controls the load and unload controls 42 and 46. The load control 42 operates under the control of the RAM access control 44, together with the master control 40, to control the queuing of data communicated to the circuit 36 at the data input terminals 32, while the unload control 46 operates under the control of the RAM access control 44 to control the unloading of queues of data from the RAM core 28 to the data output terminals 34.

The control interface 24 provides for communication of external command and control signals carried over the transaction control bus 16, as well as communication of the interface's internally-generated command and control signals. Communication of external command and control signals is provided by coupling the master control 40 with the transaction control bus 16. Communication of the internal signals is provided by coupling the master control 40 directly to the load control 42, and with the RAM access control 44. The internal signals are communicated from the RAM access control 44 by coupling the control 44 both to the load control 42 and to the unload control 46. Although the master control 40 is not directly coupled to the unload control 46, it is to be recognized that the master control 40 is indirectly coupled to the unload control 46 through the RAM access control 44. It is also to be recognized that the master control 40 may be coupled directly to the unload control 46 without departing from the principles of the invention, provided the unload control 46 receives command and control signals so as to provide its function.

The control interface 24 also provides for distribution of its internally-generated command and control signals to the other elements of the memory circuit 36. The control interface 24 distributes the internal signals to the circuit's write access interface 26 via both the RAM access control 44 and the load control 42. In addition, the control interface 24 distributes such internal signals to circuit's read access interface 30 via both the RAM access control 44 and the unload control 42. Moreover, the control interface 24 distributes the internal signals to the circuit's RAM core 28 via the RAM access control 44.

It is to be recognized that the memory circuit's control interface 24 may comprise other or different functional blocks, or other or different interconnections between functional blocks and other elements of the memory circuit 36, or both, without departing from the principles of the invention, the important point being that the control interface 24, in response to signals received over the transaction control bus 16, controls the routing of data into and out of the RAM core 28, as well as communication of data at the input and output terminals 32 and 34. It is also to be recognized that the memory circuit 36 may be configured other than as shown in FIG. 3, that is, the circuit 36 may have configurations other than two ports (P=2), and eight input and output terminals 32 and 34 (N=8), such that each circuit provides other than a four-bit memory word slice per port (N/P=4).

Figure 5:
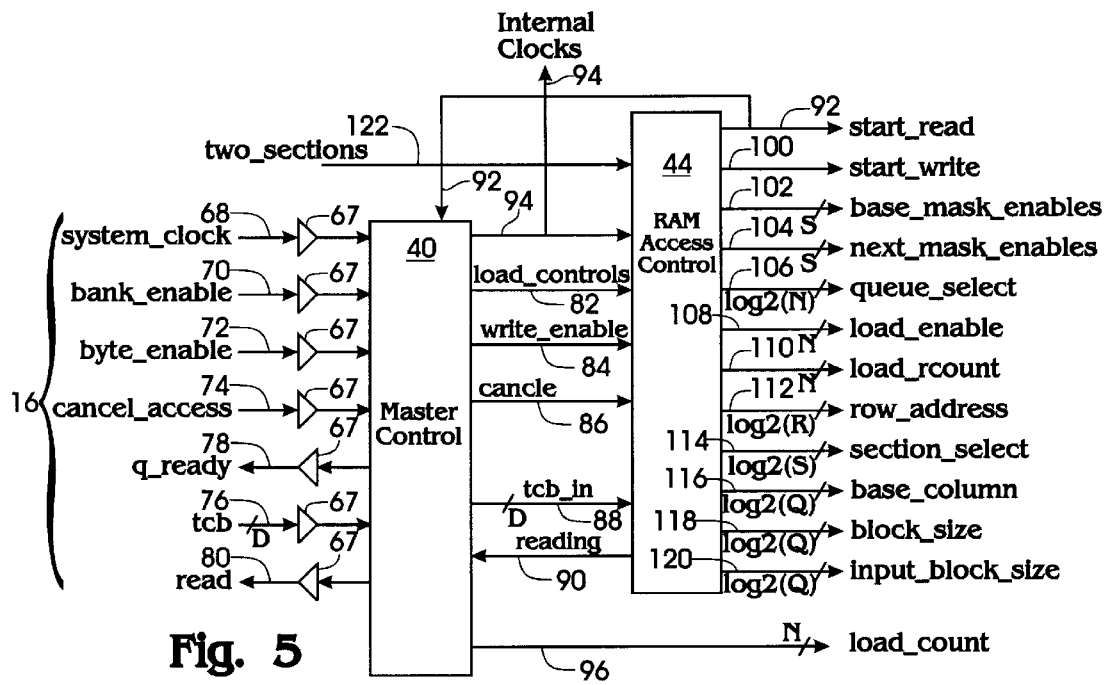
FIG. 5 shows a master control and a RAM access control according to the present invention.
Figure 6:
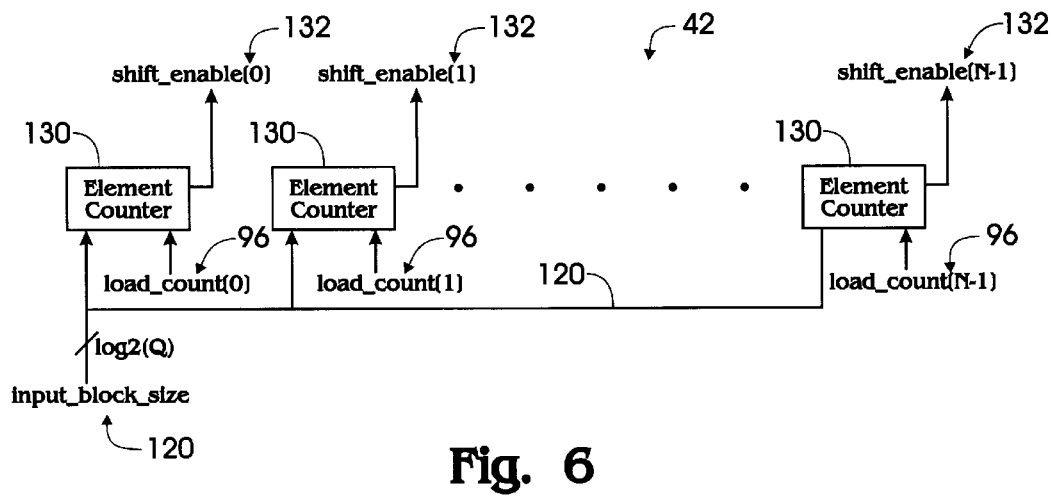
FIG. 6 shows an embodiment of a load control according to the present invention.
Figure 7:
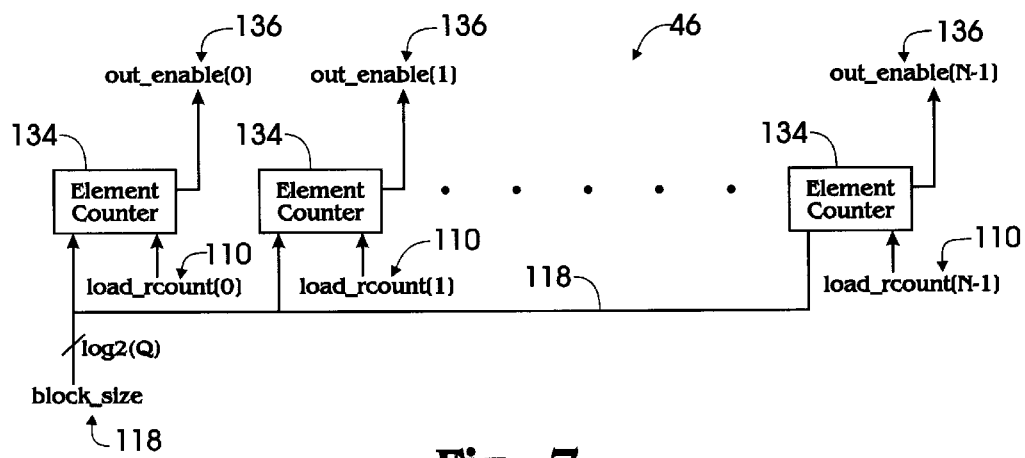
FIG. 7 shows an embodiment of an unload control according to the present invention.

FIGS. 5 through 7 show embodiments of the control interface's master control 40, RAM access control 44, load control 42 and unload control 46. In FIG. 5, the master control 40 and the RAM access control 44 are shown in association with the transaction control bus 16. The master control 40 and RAM access control 44 preferably comprise respective state machines whose implementation is readily understood to those of ordinary skill in the art, using well known digital design techniques with reference to (i) the functions performed by, and the respective signals into and out of, each such machine, (ii) the structure and function of each functional block of the memory circuit 36 and of the memory circuit 36 overall, and (iii) the timing diagrams shown in FIGS. 14 through 23, all as described herein. Moreover, using the design techniques, it is to be recognized that the master control 40 and the RAM access control 40 may be implemented as a single state machine, together with one or more other blocks of the circuit 36, without departing from the principles of the invention.

The master control 40 and transaction control bus 16 communicate therebetween external command and control signals carried over the bus 16, each signal preferably being buffered in its communication to or from the master control 40 by a respective buffer 67. The signals preferably include system clock 68, bank_enable 70, byte_enable 72, cancel_ access 74, and tcb 76, each received at the master control 40 from the transaction control bus 16, as well as q_ready 78 and read 80, both received at the transaction control bus 16 from the master control 40. The system clock 68 provides the master clock for the synchronization of data communications at the memory circuit's terminals 32 and 34, as well as for the other command and control signals communicated between the master control 40 and transaction control bus 16. It is to be recognized that the frequency of the system clock 68 may be limited by loading of the transaction control bus and, in that case, data may be communicated at the terminals 32 and 34 on both the rising and falling edges of the system clock 68 so as to maintain data bandwidth, without departing from the principles of the invention.

The tcb 76 comprises a plurality of signals for communicating transaction descriptors to the memory circuit 36. Each transaction descriptor preferably comprises one or more packets of information communicated over the tcb 76, each packet being communicated synchronous with one respective cycle of the system clock 68 and having a preselected size given by the number of signals, the number being designated herein by D. As previously described, the information associated with each transaction descriptor preferably is predefined. Transaction descriptors' information preferably is communicated in predefined fields which, as respects the memory circuit 36, preferably include fields respectively for commands, RAM array addresses, source and destination identifications, and transaction cycle counts. The commands preferably are encoded and correspond to transactions that include load, write and read transactions, while the unload function preferably is included as part of a read transaction and therefore has no separate transaction descriptor. The source and destination identifications preferably are encoded and identify the respective port 18 associated with communicated data. In that regard, if the circuit 36 is employed in a system 10 implemented as shown in FIG. 1, the source and destination identifications identify, not only the port 18, but also the respective system component 14 associated with the port. The transaction cycle count preferably describes, for load and read transactions, the number of system clock cycles for communication of data at the transaction's associated port 18 and, for write transactions, the size of the block of data to be written to the RAM array 56.

In any application, the transaction descriptors may vary in number of packets, while the descriptors' packets may vary in the number and types of fields, in particular depending on the command and, thence, the function of the particular descriptor. Conversely, the size D of the descriptors' packets preferably is invariate once selected for an application, being selected to optimize packet functionality and system performance while comporting with the design of the digital electronic system employing the transaction control bus 16 and memory circuit 36. The size D, in particular, preferably accommodates the addressing requisites of the RAM array 56. For example, a transaction descriptor packet having twelve signals, i.e., D=12, should be sufficient for a digital electronic system 10 having a main memory 12 constructed from memory circuits 36 that include eight terminals 32 and 34, i.e., N=8, and a RAM array 56 having 4,096 rows and 4,096 columns, wherein uniquely addressing each row and column requires 12 bits. In this example, then, a transaction descriptor engendering an access to the RAM array 56, e.g.

a write transaction, preferably comprises four packets, one to communicate the source identification and the command, another to communicate the size of the data block to be written, and the remaining two to communicate the address of the initial bit in the writing of the data to the array 56.

It is to be recognized that the transaction descriptors' specific definitions are largely a matter of design choice, subject to and informed by, among other things, the transactions to be performed, the applications in which the transactions are performed, and the configuration of both the memory circuit 36 and the system 10, as described above and known in the art. Accordingly, transaction descriptors' definitions are not described further herein.

Bank_enable 70 enables the circuit's reception of transaction descriptors from the tcb 76. The source of the transaction descriptor asserts the bank_enable 70 in conjunction with the source's transmission of the descriptor, preferably in conjunction with the transmission of the descriptor's first word. Where the memory circuit 36 is one of several such circuits forming memory banks in the main memory 16 of a system 10, each memory bank has an associated bank_enable signal. Accordingly, the bank enable 70 associated with the memory circuit 36 is asserted only if the circuit is in the bank addressed by the transaction descriptor.

Byte_enable 72, when asserted, enables the circuit's writing of data to the RAM array 56 in response to a write transaction descriptor. When not asserted, the circuit 36 performs the operations associated with the write transaction descriptor, but does not write data to the array 56. Byte_ enable 72 preferably is used where the memory circuit 36 is one of a plurality of memory circuits 36 organized to provide a selected word width W for one or more ports 18, the word width W being greater than one byte and the circuits 36 providing memory word slices. In such use, each byte of word width W has an associated byte_enable signal, so that the particular byte_enable signal associated with the memory circuit 36 is asserted only if the circuit 36 provides a slice of the byte addressed by the write transaction descriptor.

Cancel_access 74 provides for the cancellation of read and write transaction descriptors before execution. In a system 10, cancel_access preferably is monitored not only by the main memory 12, but also by the system components 14 so as to accurately track memory accesses. Cancel_ access 74 preferably is generated by an external algorithm monitoring memory transactions for, among other things, invalid accesses.

While the previously described signals are received at the memory circuit's master control 40, q_ready 78 and read 80 are received at the transaction control bus 16 from the master control 40. Q_ready 78 is a handshake signal asserted by the memory circuit 36 to indicate readiness to receive another read or write transaction descriptor, and deasserted to indicate receipt of such descriptors. Q_ready 78 preferably is asserted a predetermined number of system clock cycles in advance of when it is able to accept the next read or write transaction descriptor. Advance assertion has particular application when the memory circuit 36 is employed in systems 10 having arbitration algorithms to coordinate time-multiplexing of transaction descriptors over the transaction control bus 16. In such systems 10, wherein the memory circuit 36 may be one of a plurality of such circuits forming a memory bank of the main memory 12, it is preferred to employ the q_ready signal of only one circuit 36 per bank. Moreover, in such systems 10 the system components 14 preferably monitor the q_ready signals so as to determine whether to transmit data to its associated port 18 of the main memory 12.

Read 80 is another handshake signal asserted upon execution of each read transaction descriptor and deasserted prior to the circuit's communication of read data at one or more of the data output terminals 34. Read 80 preferably is deasserted a predetermined number of system clock cycles in advance of that communication. When the memory circuit 36 is employed in a system 10, advance deassertion allows the system component 14 that sent a read transaction descriptor to monitor the circuit's read 80 so as to determine when to receive data from the circuit 36.

The master control 40 and the RAM access control 44 generate internal command and control signals and communicate some of these signals therebetween. The communicated signals preferably include load_controls 82, write_enable 84, cancel 86, tcb_in 88 and internal clocks 94, each received at the RAM access control 44 from the master control 40, as well as reading 90 and start_read 92, both received at the master control 40 from the RAM access control 44.

The master control 40, in response to receipt of system clock 68, generates internal clocks 94 which are distributed, not only to the RAM access control 44, but also to the elements of the memory circuit 36 generally so as to synchronize the memory circuit's internal operations. The internal clocks 94, though derived from and preferably synchronized with the system clock 68, need not have the same frequency as the system clock 68. For example, the internal clocks 94 may be obtained by multiplying or dividing the frequency of the system clock 68.

Load_controls 82 enable loading of each word of the transaction descriptor received by the master control 40 into the RAM access control 44.

Write_enable 84, cancel 86 and tcb_in 88 comprise synchronized versions, respectively, of byte_enable 72, cancel_access 74 and tcb 76 received over the transaction control bus 16. Write_enable 84 preferably determines whether data is replaced in the write back registers of the sense/write circuit 60 during a write transaction.

Reading 90 is an internal version of read 80 transmitted from the master control 40 over the transaction control bus 16. Start_read 92 enables the start of the read phase of a row access in the RAM array 56. Start_read is generated by the RAM access control and communicated both to the master control 40 and to row access control 58 of the RAM core 28.

The master control also generates a load_count 96 that is directed to and controls operation of the load control 42. Load_count 96 is described hereinafter in the description of the load control 42.

The RAM access control 44 generates and communicates internal command and control signals in addition to those directed to the master control 40. These signals preferably include start_write 100, base_mask_enables 102, next_mask_enables 104, queue_select 106, load_enable 108, load_rcount 110, row_address 112, section_select 114, base_column 116, block_size 118, and input_block_size 120.

Start_write 100 is directed to the row access control 50 of the RAM core 28 to start the write phase of a RAM array access.

Base_mask_enables 102 are directed to the RAM core 28. Each signal of base_mask_enables 102 enables bit replacement in the RAM array's addressed row, in particular in the signal's associated section 57. The bits preferably are replaced when the respective signal of the base_mask_enables 102 is asserted. Because each row in the RAM array 56 preferably is divided into S sections 57, base_mask_enables 102 preferably comprises S signals.

Next_mask_enables 104 are directed to the RAM core 28. Each signal of next_mask_enables 104 enables bit replacement in the next-consecutive section 57 of the RAM array's addressed row after the section associated with the corresponding signal of the base_mask_enables 102. The bits preferably are replaced when the respective signal of next_mask_enables 104 is asserted. The next_mask_enables preferably also comprise S signals, one corresponding to each section 57 in a row of the RAM array 56.

Queue_select 106 selects one of the in queue registers 52 of the write access interface 26 in the transfer of enqueued data to the routing/mask circuit 54. Broadly, queue_select 106 triggers routing of the selected register's enqueued data to the RAM array 56 during the execution of a write transaction descriptor. Where the number of in queue registers 52 is N, queue_select 106 preferably comprises $\log_2(N)$ signals.

Load_enable 108 controls the loading of data read from the RAM array 56 into a corresponding out queue register 64. The number of signals of the load_enable 108 preferably is in one-to-one relationship with the number of out queue registers 64. Accordingly, where the number of out queue registers 64 is N, the number of signals of load_enable 108 preferably is N.

Load_rcount 110 is directed to the unload control 46 in controlling the operation thereof. Load_rcount 110 is described hereinafter in the description of the unload control 46.

Row_address 112, section_select 114 and base_column 116 comprise the address signals for accessing the RAM array 56 and reading selected data therefrom. Row_address 112 is directed to the row access control 58 of the RAM core 28 to control row accesses of the RAM array 56. As the number of rows in the RAM array 56 is R, row_address 112 preferably comprises $\log_2(R)$ signals. Section select 114 signals are directed to the read data routing circuit 62 of the read access interface 30 to identify sections 57 associated with an addressed row of the RAM array 56 from which data is routed to the out queue registers 64. Section_select 114 preferably comprises $\log_2(S)$ signals where S represents the number of sections 57 per row. Base_column 116 is directed to the read data routing circuit 62. Base_column 116 selects, within the selected section 57 of the addressed row of the RAM array 56, the particular column where the addressed data begins. Base_column 116 is also directed to the routing/mask circuit 54 of the write access interface 26 for generating control signals that provide for writing of data from a particular addressed column in a section 57. Base_column 116 preferably comprises $\log_2(Q)$ signals, where Q represents the number of columns per section 57.

In generating row_address 112, as well as start_read 92 and start_write 100, the RAM access control 44 is responsive not only to the signals received from the master control 40, but also to two_sections 122. Two_sections 122 is generated by the routing/mask circuit 54 of the write access interface 26 and indicates to the RAM access control 44 when a RAM access engenders the crossing of the boundary between two sections of the RAM array 56. Moreover, if the section_select 114 identifies the last section of a row, two_sections 122 indicates the crossing of a row boundary. When a row boundary crossing is so indicated, the RAM access control 44 preferably generates two successive sequences of access signals row_address 112, start_read 92 and start_write 100. The first sequence of row_address 112, start_read 92 and start_write 100 provides for access to a row for the first section of data to be written to or read from the RAM array 56. The second sequence of such access signals provides for access to the row having the next section, which preferably is the next consecutive row in the RAM array 56. Two_sections 122 is described further herein with respect to the write access interface 26.

Block_size 118 is directed to the routing/mask circuit 54 of the write interface 26 and describes the size of the block of data associated with a read or write transaction descriptor. That is, block_size 118 determines the number of bits to be replaced or read from each section 57 of a row of the RAM array 56 in, respectively, write and read transactions. Block_size 118 preferably comprises $\log_2(Q)$ signals, where Q represents the number of columns in each section 57 of the RAM array 56.

Input_block_size 120 is directed to the load control 42 in controlling the operation thereof. Input_block_size 120 describes the size of the block of data associated with an associated transaction descriptor. Input_block_size 120 is described further in the following description of the load control 44.

As previously described, the load control 42 operates under the control of the RAM access control 44, together with the master control 40, to control the in queue registers' queuing of data communicated to the circuit 36 at the data input terminals 32. The load control 42, as shown in FIG. 6, preferably comprises a plurality of element counters 130, each having input_block_size 120 and load_count 96 as inputs thereto, and a shift_enable signal 132 as an output therefrom for communication to a respective in queue register 52. The number of element counters 130 preferably is in one-to-one correspondence with the number of in queue registers 52 so that each counter 130 individually controls the operation of a respective register 52 through the generation of the respective shift_enable signal 132. In particular, because the number of registers 52 preferably corresponds to the number of input terminals 32, the number of element counters 130 preferably is N, where N designates the number of input terminals 32 as previously described.

The element counters 130 preferably comprise down counters and each element counter 130 preferably operates independently of the others. Upon execution of a transaction descriptor implicating one or more of the element counters 130, such counters 130 are individually loaded with input_block_size 120, describing the size of the data block associated with the transaction descriptor. The other element counters 130 may be loaded with a value of input_block_size 120 corresponding to a previous or succeeding transaction descriptor. The value of the input_block_size 120, accordingly, may vary from transaction descriptor to transaction descriptor and, thence, from counter 130 to counter 130. In addition, the input_block_size 120 preferably has values ranging from one bit to the full bit depth Q of the in queue registers 52. So as to represent block sizes up to Q, the input_block_size 120 preferably comprises $\log_2(Q)$ signals. It is to be recognized that input_block_size 120 may be received at the load control 42 from the transaction control bus 16 directly or otherwise, rather than from the RAM access control 44, without departing from the principles of the invention.

Loading of input_block_size 120 into one or more element counters 130 is triggered by receipt of the load_count 96 associated with that counter 130. Accordingly, load_count 96 preferably comprises a plurality of signals, one for each element counter 130. For example, where the element counters 130 number N, load_count 96 preferably numbers N signals. It is to be recognized that, when the circuit 36 has a plurality of ports 18 and provides a word slice N/P bits wide, each transaction descriptor associated with receiving data at a particular port preferably engenders generation of N/P signals of load_count 96, each of these signals being directed to a respective element counter 130 associated with that receiving port so as to initially load therein the input_block_size 120. Moreover, in that case, each of the element counters 130 associated with that receiving port will be initially loaded with a common-valued input_block_size 120 and, while data is to be enqueued, each will generate a shift_enable signal 132 to enable the respective register.

In operation, each element counter 130, while holding a non-zero value, enables the enqueuing of data into the respective in queue register 52 by asserting the shift_enable 132 associated therewith. For each bit of data so enqueued in a register 52, the respective element counter 130 decrements once. When the counter 130 decrements to zero, the counter 130 disables enqueuing of data and ceases to decrement.

As previously described, the unload control 46 operates under the control of the RAM access control 44 to control the queuing of data from the RAM core 28 for communication at the data output terminals 34. The unload control 46, as shown in FIG. 7, preferably has substantially similar structure as the load control 42 and operates in a substantially similar manner as the load control 42, except its operations are directed at controlling the out queue registers 64 in the communication of data from the circuit 36. That is, the unload control 46 comprises a plurality of element counters 134, each preferably being substantially similar to the element counters 130 of the load control 42. These counters 134 have as inputs thereto block_size 118 and load_rcount 110, both of which have substantially similar functions and parameters as the corresponding input signals of the load control's element counters 130. These counters 134 have as outputs therefrom out_enable signals 136, which are described hereinafter with respect to the read access interface 30. Accordingly, the design and operation of the unload control 46 is readily understood by those of ordinary skill in the art by reference to the description of the load control 42, as well as the disclosures hereof generally.

With respect to the load control 42 and the unload control 46, it is preferred that each element counter 130 and 134 is operatable independently of each of the other such counters 130 and 134.

Figure 8:
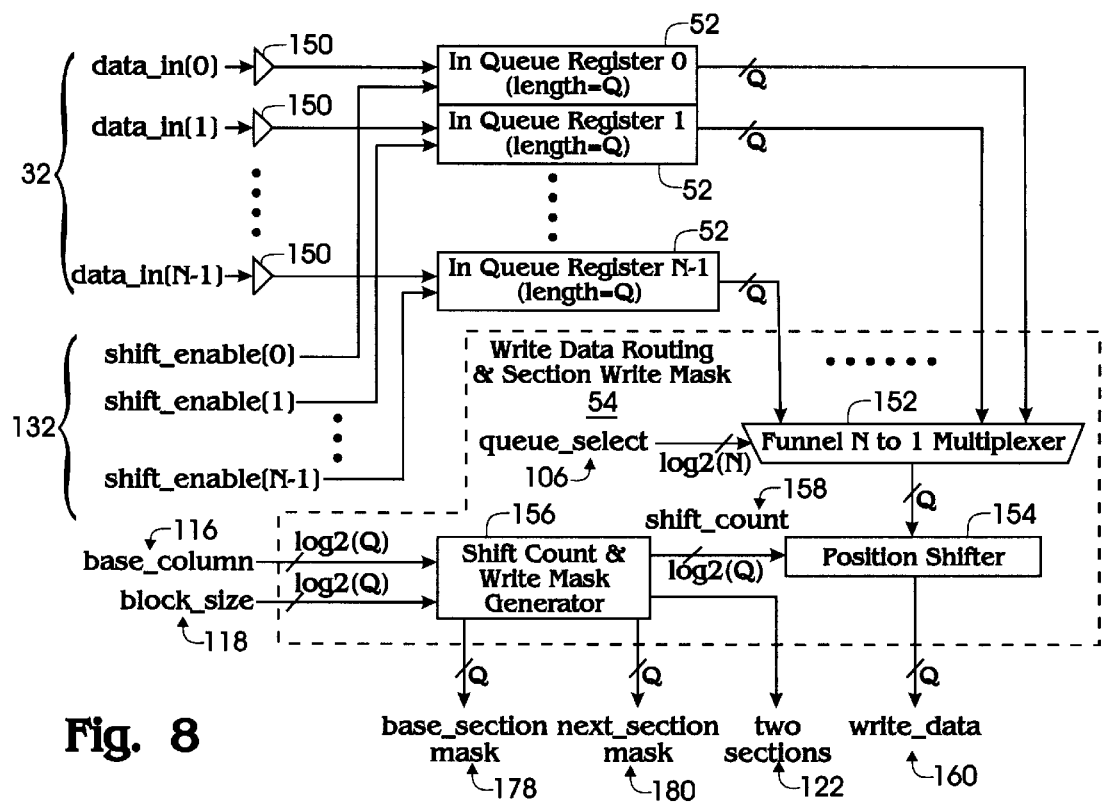
FIG. 8 shows an embodiment of a write access interface according to the present invention.

Referring to FIG. 8, the write access interface 26 preferably comprises N input terminals 32, each coupled respectively by a buffer 150 to one of N in queue registers 52. The buffers 150 implement the data input interface 50 of FIG. 3. The in queue registers 52 preferably comprise queues, each controlled independently by a respective shift_enable signal 132 received from the control interface 24. Each in queue register 52 has a depth Q and receives data serially while enabled by the respective shift_enable signal 132, the shift_enable signal 132 preferably enabling data reception only while valid data is to be enqueued for the respective transaction. As previously described, each in queue register 52 receives data synchronously with the system clock 68, either at the clock's frequency or at double that frequency, e.g. at both edges. In a typical implementation, Q=256 and N=8.

It is to be recognized that, when the data input terminals 32 are grouped to form a selected number P of ports 18 each having an associated word slice N/P bits wide, the in queue registers 52 preferably are grouped in N/P registers 52 per port. In that case, when executing a transaction descriptor identifying a particular port, the associated N/P in queue registers 52 are each enabled and disabled by the descriptor.

Each in queue register's enqueued data is received, in parallel, by the routing/mask circuit 54. This reception includes up to Q bits, and is controlled by the queue_select 106 which the routing/mask circuit 54 receives from the control interface 24. As described above, queue_select 106 selects one of the in queue registers 52 for transfer of the data enqueued therein to the routing/mask circuit 54.

The routing/mask circuit 54 preferably provides for routing of data from the in queue registers 52 to the addressed locations in the RAM array 56 and, to do so, generates masking control signals that enable only the valid data to be replaced in the write back registers of the sense/write circuit 60. As shown in FIG. 8, the routing/mask circuit 54 preferably comprises a multiplexer 152, a position shifter 154, and a shift count and write mask generator 156. The multiplexer 152 selectably receives the data enqueued by the particular register 52 identified by the queue select 106 and routes it to the position shifter 154. It is to be recognized that, when the in queue registers 52 are grouped as N/P registers 52 per port, the execution of a write transaction descriptor engenders consecutive retrievals of data from the implicated registers 52.

The position shifter 154 preferably comprises a barrel shifter for rotating the data received from the multiplexer 152 and for transferring the rotated data to the RAM core 28. The position shifter 154 is responsive to shift count signal 158 provided by the routing/mask circuit's shift count and write mask generator 156. The position shifter 154 rotates the data to adjust for the extent the data was pushed into the respective in queue register 52 and to provide for the data's relative position in a section 57 as addressed in the associated transaction descriptor. The position shifter 154 preferably transfers the data to the RAM core 28 in Q parallel bits over write_data signals 160.

It is to be recognized that the routing/mask circuit 54 can be implemented without using the position shifter 154, without departing from the principles of the invention. For example, the data is enqueued into the in queue registers 52 by sequentially loading starting at any appropriate position in such registers 52 during the respective load operation. This alternative relies on implementing a shift function in each in queue register 52. Accordingly, this alternative implicates having additional circuitry in such registers 52 while not having the position shifter 154 in the routing/mask circuit 54.

Figure 9:
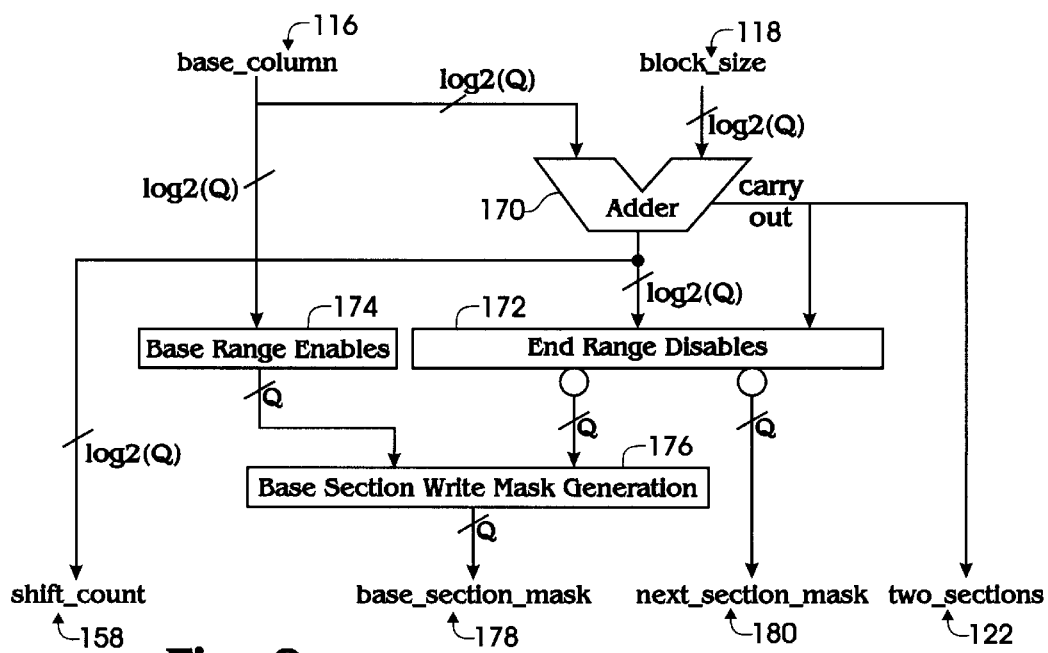
FIG. 9 shows an embodiment of a shift count and write mask generator circuit according to the present invention.

Referring to FIGS. 8 and 9, the routing/mask circuit's shift count and write mask generator 156 preferably comprises an adder 170, an end range disables circuit 172, a base range enables circuit 174 and a base section write mask generation circuit 176. The circuits 172, 174 and 176 preferably comprise decoding logic.

The generator 156 has base column 116 and block_size 118 as input signals, which are received from the control interface 24. Responsive to such signals, the generator 156 generates (i) shift_count 158 for routing to the position shifter 154, (ii) two_sections 122 for routing to the control interface 24, and (iii) base_section_mask 178 and next_section_mask 180 for routing to the RAM core 28.

Base_section_mask 178 and next_section_mask 180 comprise the masking control signals that enable only the valid data to be replaced in the write back registers of the sense/write circuit 60. More specifically, base_section_mask 178 selects the bits to be replaced within each selected section 57 associated with the transaction descriptor being executed. To do so, base_section_mask 178 preferably comprises a map of Q mask bits: each bit corresponds to a respective signal in write data 160 such that, when a mask bit is asserted, the section bit is replaced with the respective bit carried over that write_data signal 160. Next_section_mask 180 performs a function substantially similar to that of base_section_mask 178, except it provides for bit replacement in the consecutive section 57 next-following the selected section 57, so as to accommodate a RAM access that crosses the boundary between two sections.

To generate these masking control signals, the generator's adder 170 adds the base_column 116 and the block_size 118. The adder's resulting value comprises shift_count 158, while the adder's carry out comprises two_sections 122. The base range enables circuit 174 decodes base_column 116 to generate enables from the addressed base column (i.e., the relative position in a section 57 where valid data begins) to the end of the section 57 associated with the base_column 116. The end range disables circuit 172 decodes shift_count 158 and two_sections 122 to obtain, relative to the section 57 of the base_column 116, disables for all columns following the end of valid data to the end of the next consecutive section 57. The end of valid data may fall either in the base column's section 57 or in the next consecutive section. The disables failing in the next consecutive section comprise the next_section_mask 180. The disables falling in the base column's section 57 are routed to the base section write mask generation circuit 176, together with the enables generated by the base range enables circuit 174. The generation circuit 176, which preferably comprises a set of AND gates, combines the corresponding bits received from the circuits 174 and 172 to generate base_section_mask 178.

Where valid data crosses a row boundary, the RAM access control 44 preferably generates a second sequence of the access signals row_address 112, start_read 92 and start_write 100, responsive to two_sections 122 as previously described. However, additional masking control signals preferably are not generated. That is, the RAM access control 44 generates the second sequence of access signals so that the original next_section_mask 180 can be used to identify the valid data of the next section even though the next section is in a row separate from the base section.

Figure 10:
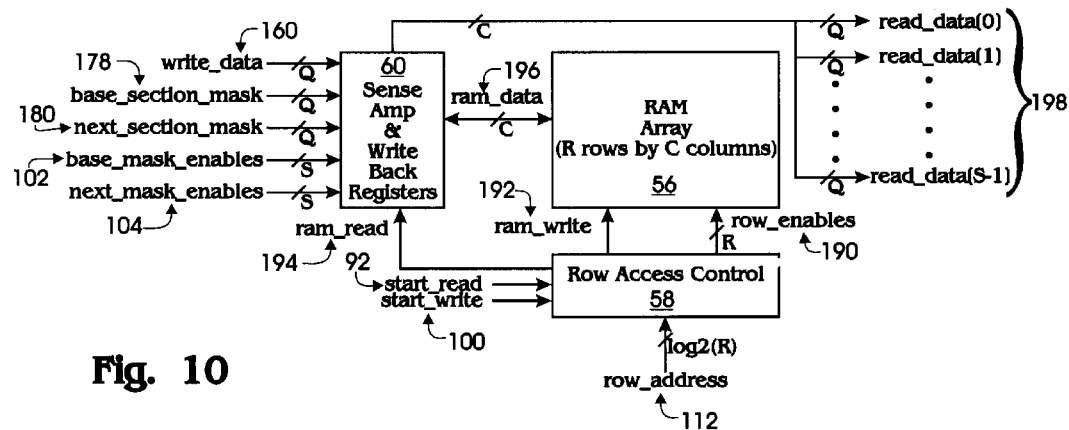
FIG. 10 shows an embodiment of a RAM core according to the present invention.
Figure 11:
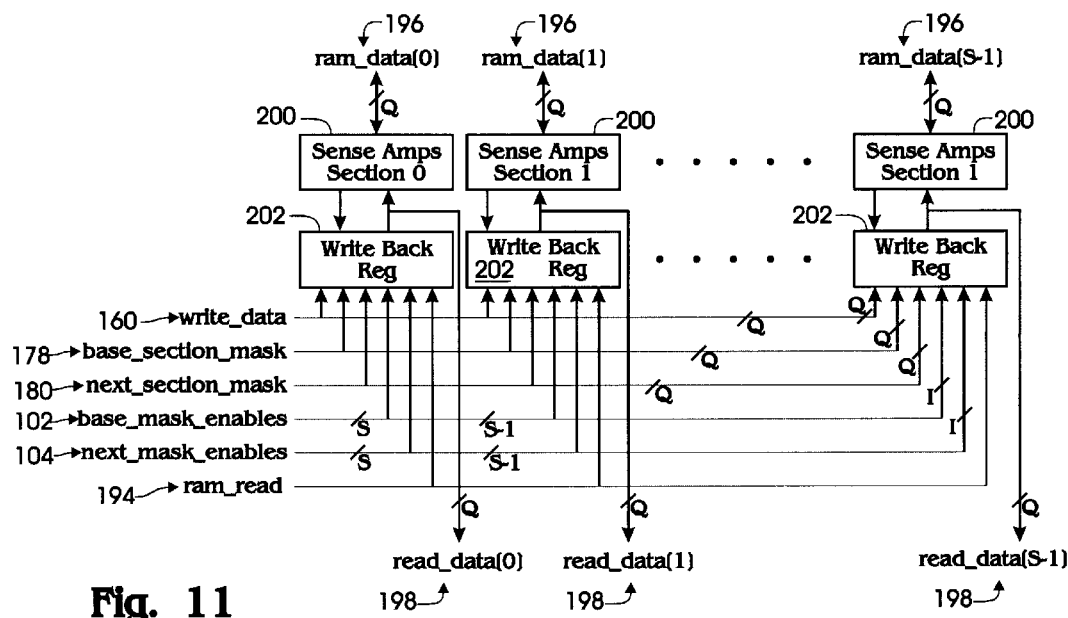
FIG. 11 shows an embodiment of a sense amplifiers and write back registers circuit according to the present invention.

Referring to FIGS. 10 and 11, the RAM core 28 preferably comprises the RAM array 56 for storing data; the row access control 58 for enabling and controlling accesses of the RAM array 56; and the sense amplifiers and write back registers 60 for both buffering data to and from the RAM array 56 and temporarily storing a row of accessed data. The RAM array 56, as previously described, preferably comprises a conventional memory array, and has R rows and C columns.

The row access control 58 preferably comprises decoding logic. The control 58 receives row_address 112, start_read 92 and start_write 100 from the control interface 24, generates row_enables 190 and ram_write 192 for routing to the RAM array 56, and generates ram_read 194 for routing to the sense amplifiers and write back registers 60. Row_enables 190, generated from the decode of the row_address 112, enable access to the rows of the RAM array 56. Row_enables 190 preferably comprises R signals, each signal corresponding to a respective row of the RAM array 56. In operation, preferably only one signal of row_enables 190 is asserted at a time so as to limit access of the RAM array 56 to only one row at a time. Ram_write 192 and ram_read 194 comprise timing signals that control the RAM array 56 and the sense amplifiers and write back registers 60, respectively, in buffering data therebetween. Ram_write 192 and ram_read 194 each preferably comprise one signal. In generating ram_write 192 and ram_read 194, the row access control 58 is responsive to start_write 100, start_read 92 and row_address 112 in the execution of write and read transaction descriptors. Accordingly, when a RAM access crosses a row boundary, the second sequence of access signals generated by the RAM access control 44 preferably triggers the generation of a corresponding second sequence of ram_write and ram_read signals 192 and 194.

The sense amplifiers and write back registers 60 comprise sense amplifiers 200 and a write back register 202. As shown in FIG. 11, both the sense amplifiers 200 and the write back register 202 are logically organized in S sections, each corresponding to a respective section 57 of a RAM array row. Accordingly, each section of the amplifiers 200 and write back register 202 buffers data for Q columns of the RAM array 56, Q being the depth of each section 57. It is to be recognized, however, that the sense amplifiers 200 and write back register 202 preferably have one sense amplifier and one register element respectively for each column of the RAM array 56.

The sense amplifiers 200 buffer data to and from the RAM array 56 over ram_data 196. If the RAM array 56 is DRAM, a complete row, comprising C bits of data, is read into the sense amplifiers 200 from the array and written back to the array on every access. Accordingly, ram_data 196 preferably comprises C signals. Because the sense amplifiers 200 are organized in sections, the signals of ram_data 196 preferably are organized in S groups, each group having Q signals.

The write back register 202, in read transactions, routes data to the read access interface 30 over read_data 198. Corresponding to the physical and logical organization of the write back register 202, read_data 198 preferably comprises C signals that are organized in S groups, each group having Q signals. Each group of Q signals of read_data 198 is associated with a respective logical section of the write back register 202.

Ram_read 194 causes the data sensed by the sense amplifiers 200 to be latched in the write back register 202 for temporary storage, the row being enabled by one signal of row_enables 190. If the access corresponds to execution of a read transaction, the one or more sections 57 of data corresponding to the transaction are routed over read_data 198 to the read access interface 30 before the read data is written back to the RAM array 56.

If the access corresponds to execution of a write transaction, the write back register 202 receives new data from the write access interface 26 over write_data 160. As previously described, write_data 160 preferably comprises Q parallel signals, where Q is the depth of each in queue register 52. Accordingly, Q bits of new data, so received, replace the appropriate data in the write back register 202 in each clock cycle preceding writing of the data back to the enabled row of the RAM array 56. Ram_write 192 writes all of the data from the write back register 202 to the enabled row of the RAM array 56 whether or not data has been replaced in every section of the register 202.

Each read and write transaction preferably is associated with one or two RAM accesses so as to comprise transfer of up to C bits of data, C being the number of columns in a full row of the RAM array 56. As a first example, if the circuit 36 is configured as one port (P=1), then up to C bits of valid data can be transferred because all of the in queue registers 52 are associated with that port. In that case, if all of the in queue registers 52 are fill of data and the data is to be written starting at the beginning of a row, that data will replace the read data in each of the corresponding sections of the write back register 202 prior writing back to the RAM array 56. Moreover, all of that data will be written to the RAM array 56 in one RAM access. If, however, the data is to be written starting other than at the beginning of a row, two RAM accesses are necessary to write the data to the RAM array 56. As a second example, if the circuit 36 is configured as N ports where N is the number of in queue registers 52, only the valid data in the single in queue register 52 associated with the port replaces data in the write back register 202. Accordingly, less than C bits is transferred. Nevertheless, two RAM accesses may be necessary in writing the data to the RAM array 56, depending on where the writing of data is to start relative to the end of a row.

The write back register 202 preferably comprises flip flops that select between the output of the sense amplifiers 200 and the bits received from the write access interface 26. As shown in FIG. 11, each section of the write back register 202 receives in parallel the bits from the write access interface 26. Each section also receives a respective signal of base_mask_enables 102, next_mask_enables 104, base_section_mask 178 and next_section_mask 180. If the signal of base_mask_enables 102 associated with a particular section of the write back register 202 is asserted, bit replacement is enabled for that section. The base_section_mask 178 determines which bits are replaced in the enabled section. Where the replacing data crosses a section boundary, the signal of next_mask_enables 104 associated with the next-consecutive section of the write back register 202 is asserted, enabling bit replacement in that section. The next_section_mask 180 determines which bits are replaced in that enabled next section.

Figure 12:
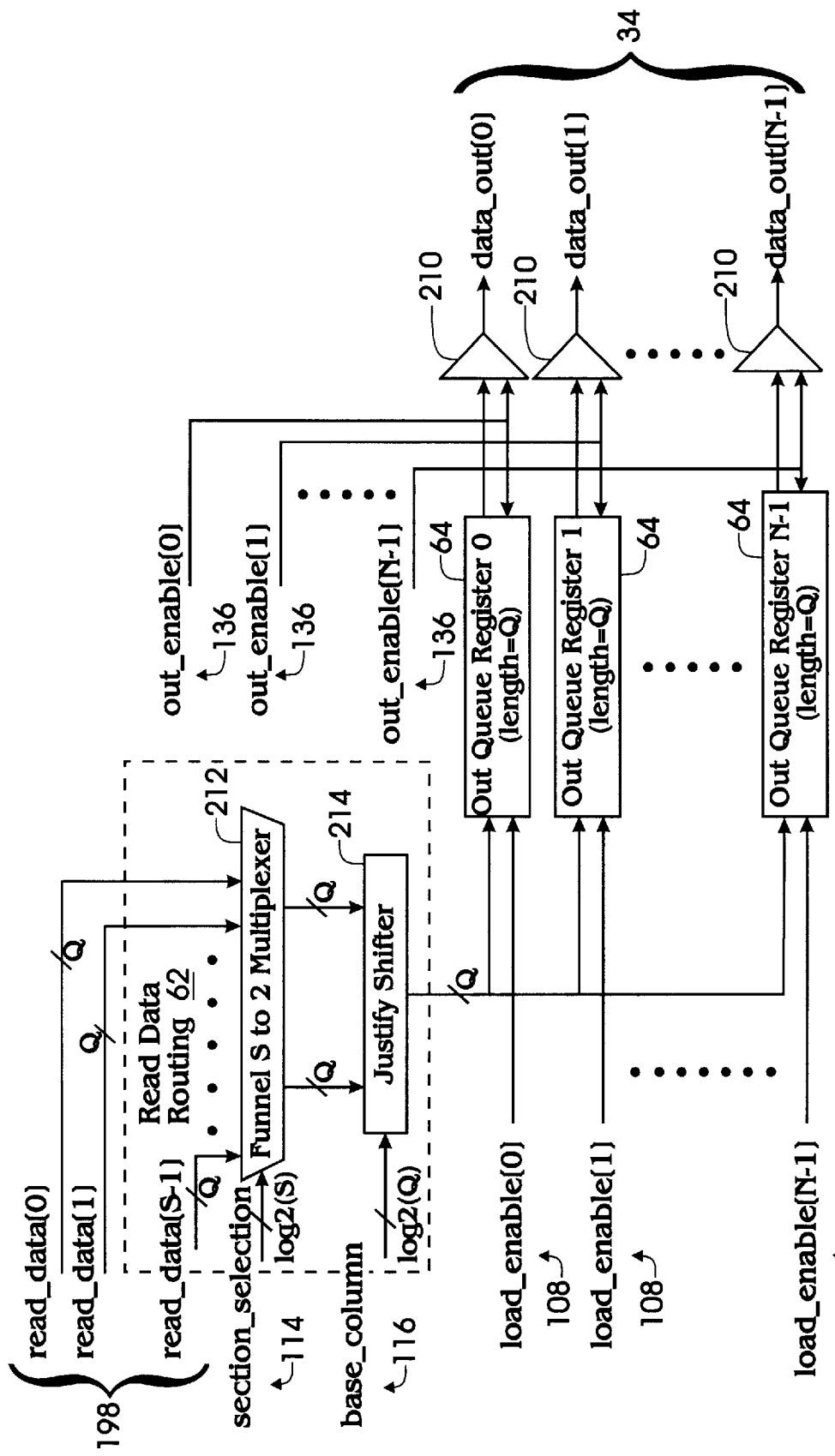
FIG. 12 shows an embodiment of a read access interface according to the present invention.

Referring to FIG. 12, the read access interface 30 preferably comprises N output terminals 34, each coupled respectively by a buffer 210 to one of N out queue registers 64. The buffers 210 implement the data output interface 66 of FIG. 3. The out queue registers 64 preferably comprise queues, each controlled independently by a respective out_enable signal 136 received from the control interface 24. The out_enable signals 136 enable and disable routing of data from the out queue registers 64 to the buffers 210, and control the buffering of that data through the buffers 210 to the data output terminals 34. The out_enable signals 136 preferably enable routing only while valid data is enqueued for the respective transaction.

Each out queue register 64 has a depth Q and, while enabled by the respective out_enable signal 136, serially routes data to the respective buffer 210. As previously described, each out queue register 64 routes data synchronously with the system clock 68, either at the clock's frequency or at double that frequency, e.g. at both edges. In a typical implementation, as previously described with respect to the in queue registers 52, Q=256 and N=8. It is to be recognized that, when the data output terminals 34 are grouped to form a selected number P of ports 18 each having an associated word slice N/P bits wide, the out queue registers 64 preferably are grouped in N/P registers 64 per port. In that case, execution of a read transaction descriptor identifying a particular port entails enabling and disabling each of the associated N/P out queue registers 64.

Each out queue register 64 receives data, in parallel, from the read data routing circuit 62. This transmission includes up to Q bits and is controlled by the register's respective load_enable signal 108. When a load_enable signal 108 is asserted, the signal's respective out queue register 64 is enabled to receive data.

The read data routing circuit 62 provides for routing of data from the RAM core 28 to the respective out queue register 64 associated with the data's corresponding read transaction. The read data routing circuit 62 receives section_select 114 and base_column 116 from the control interface 24 and receives data in sections from the RAM core 28 over read_data 198. The read data routing circuit 62 comprises a multiplexer 212 and a justify shifter 214. The multiplexer 212 selects the section 57 of RAM array data identified by section_select 114, as well as the next consecutive section 57 in order to accommodate crossing of section boundaries by the valid data. The justify shifter 214 receives the two sections of data selected by the multiplexer 212 and, responsive to base_column 116, justifies the data so that the initial bit of the valid data is loaded into the first location in the respective out queue register 64. To route the justified data to the appropriate register 64, the justify shifter 214 is coupled in parallel to each out queue register 64. It is to be recognized that, when the out queue registers 64 are grouped as N/P registers 64 per port, the execution of a read transaction descriptor engenders consecutive routings of data from the justify shifter 214 to the implicated registers 64.

It is to be recognized that the read data routing circuit 62 can be implemented without using the justify shifter 214, without departing from the principles of the invention. For example, read data can be loaded from the RAM array 56 directly into the out queue registers 64 provided the loaded data may be output from such registers 64 starting at any randomly selectable position therein, such selected position corresponding to the beginning of the valid data. This alternative relies on implementing a random access function in each of the out queue registers 62. Accordingly, this alternative implicates having additional circuitry in such registers 64 while not having the justify shifter 214 in the read data routing circuit 62.

Figure 13:
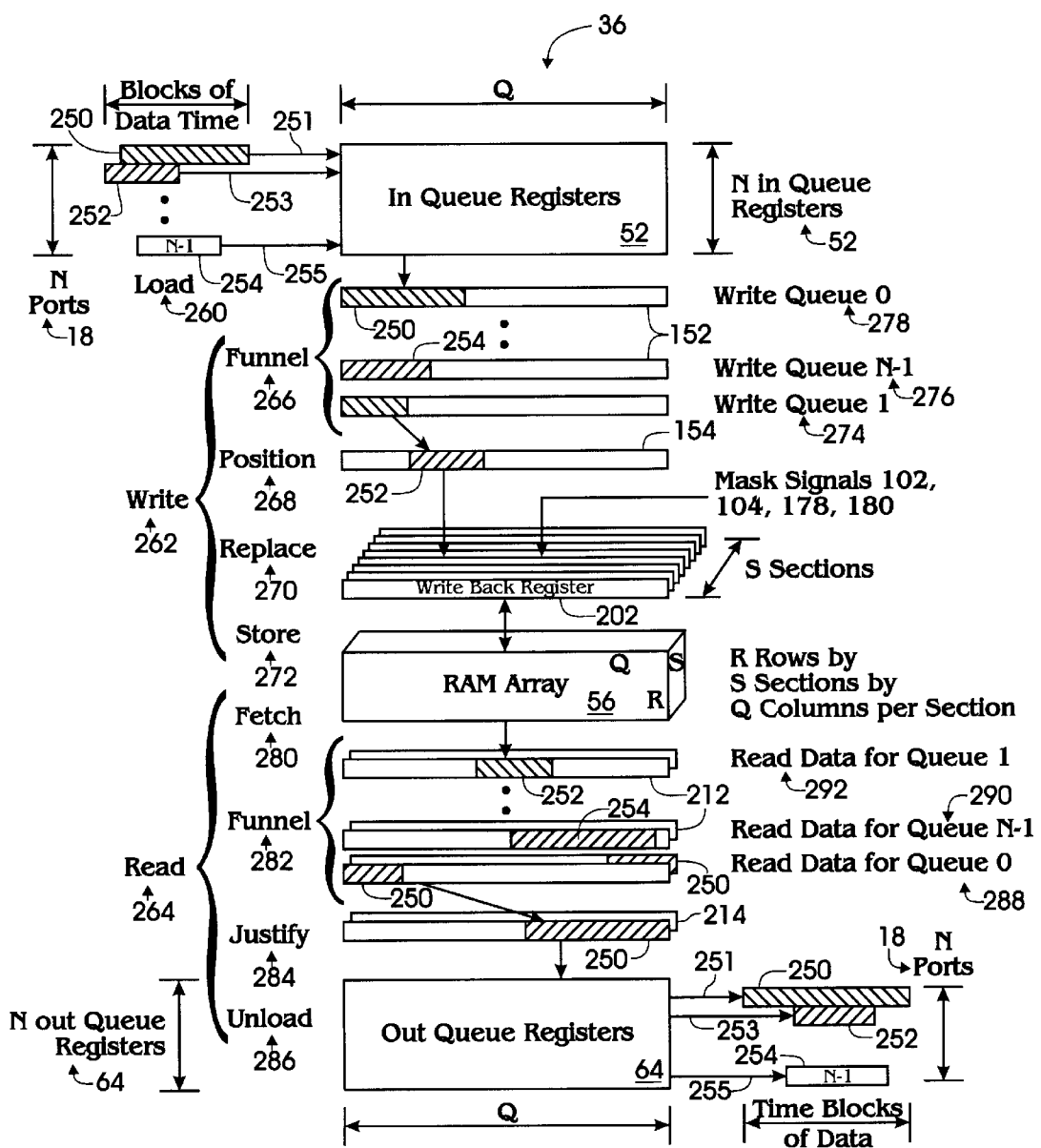
FIG. 13 shows a data flow diagram of a memory circuit according to the present invention.

The operation of the memory circuit 36 is depicted in FIG. 13 with reference to the in queue registers 52, the multiplexer 152 and position shifter 154 of the write data routing and section write mask circuit 54, the write back register 202, the RAM array 56, the multiplexer 212 and the justify shifter 214 of the read data routing circuit 62, and the out queue registers 64. The memory circuit 36 is configured to have N ports 18 and is depicted receiving, at the in queue registers 52, data block 250 from port 251, data block 252 from port 253 and data block 254 from port 255. Data block 252 is received first; data block 250 is received second; and data block 254 is received third. Each of the data blocks 250, 252 and 254 are depicted being routed from the out queue registers 64 at ports 251, 253 and 255, respectively. Data block 250 is routed first; data block 254 is routed second; and data block 252 is routed third.

The memory circuit's operation is illustrated for three types of transaction descriptors: load descriptors 260, write descriptors 262 and read descriptors 264. One descriptor of each type is contemplated to trigger memory circuit operations respecting each data block 250, 252 and 254. Generally, each descriptor type has associated therewith a series of predefined steps.

Load descriptors 260 preferably have as a principal step the loading of data into the in queue registers 52. Each load descriptor 260 controls the loading of data into the one or more registers 52 corresponding to the port 18 associated with the descriptor 260. Load descriptors 260 preferably are accepted at any time. Moreover, each port 18 can load data in response to a load descriptor 260 associated with that port while any or all other ports 18 are loading data in response to load descriptors associated therewith. Moreover, execution of load descriptors 260 is independent of execution of both write descriptors 262 and read descriptors 264.

Once the memory circuit 36 initiates a load in response to a load descriptor 260, the circuit preferably executes the load operations to completion independent of all other memory circuit activity. If the memory circuit 36 is configured for multiple ports 18, as shown in FIG. 13, multiple load descriptors 260 can be in various stages of execution at any given time. The load descriptors 260 can accommodate data blocks ranging from one bit up to Q bits, where Q preferably is equal to the depth of the in queue registers 52.

Write descriptors 262 preferably have as principal steps a funnel operation 266, a position operation 268, a replace operation 270 and a store operation 272. Through these steps, each write descriptor 262 provides for transferring data from the in queue registers 52 associated with the descriptor's port to the RAM array 56 for storage at an address specified in the descriptor. Although as shown each port has associated therewith a single in queue register 52, it is to be recognized that each port may have a plurality of associated registers 52, without departing from the principles of the invention.

The funnel operation 266 selects the in queue registers 52 associated with the descriptor's port for transfer of the data enqueued, at one register per clock cycle, to the position shifter 154. The funnel operation 266 employs the multiplexer 152 of the routing/mask circuit 54. The position operation 268 shifts the valid data received from each in queue register 52 to provide for positioning the data in a section 57 in accordance with the addressing of the descriptor, or in two consecutive sections 57 when the positioning causes the data to cross a section boundary. The replace operation 270 employs the write back register 202 to replace data read from the RAM array 56 into the write back register 202 with the valid data from the in queue registers 52. The replace operation 270 replaces bits starting with the section 57 in which the descriptor's base address resides and moves through sequential sections, one for each in queue register 52 associated with the write descriptor 262. The mask signals 102, 104, 178 and 180 are employed in this operation to determine which bits get replaced, including when data blocks cross section boundaries in the replacement operation 270. The store operation 272 transfers the entire contents of the write back register into the enabled row of the RAM array 56 responsive to the write descriptor 262. As previously described, a single write descriptor may engender two accesses to the RAM array 56 when data blocks cross a row boundary.

FIG. 13 depicts execution of a sequence of write descriptors 274, 276 and 278 associated with data blocks 252, 254 and 250, respectively. The write descriptor 274 has progressed to the replace operation 270, while the write descriptor 276 is ready to begin the position operation 268 and the write descriptor 278 is completing the funnel operation 266. The progress in execution of the write descriptors 274, 276 and 278 preferably reflects the order of the descriptors' receipt by the memory circuit 36.

Read descriptors 264 preferably have as principal steps a fetch operation 280, a funnel operation 282, a justify operation 284 and an unload operation 286. The fetch operation 280 comprises reading a complete row of data from the RAM array 56, as addressed by the read descriptor 264. The funnel operation 282 comprises transferring, to the justify operation's justify shifter 214, two sections of fetched data for each out queue register 64 corresponding to the port 18 of the descriptor 264, each register's two sections being transferred in a single clock cycle. Funnelling two consecutive sections of data ensures reading all bits of a data block that crosses section boundaries, i.e., if a data block is stored in the RAM array 56 so as to cross a section boundary, the data block is stored in two consecutive sections and can be read from the array by operating on both the addressed section and the next consecutive section. The justify operation 284 justifies the funnelled data so that the initial bit of valid data is loaded into the first location in the respective out queue register 64. The unload operation 286 comprises routing the justified data from the memory circuit 36 through the out queue registers 64 corresponding to the port 18 associated with the read descriptor 264. Once initiated by the read descriptor 264, the unload operation 286 preferably executes to completion independent of any other memory circuit activity. If the memory circuit 36 is configured for multiple ports 18, as shown in FIG. 13, multiple unload operations 286 can be in various stages at any given time.

FIG. 13 depicts execution of a sequence of read descriptors 288, 290 and 292 associated with data blocks 250, 254 and 252, respectively. The read descriptor 288 has progressed to the unload operation 286. The read descriptor 290, having completed the funnel operation 282, is ready to begin the justify operation 284. The read descriptor 292 has completed the fetch and funneling operations 280 and 282. As shown for data block 250, the justify operation 284 justifies the data into one section even if, as fetched, it crosses section boundaries.

The progress in execution of the read descriptors 288, 290 and 292 preferably reflects the order of their receipt by the memory circuit 36. Moreover, when both read and write descriptors 262 and 264 are received by the memory circuit 36, accesses to the RAM array 56 preferably are executed sequentially in the order of the descriptors' receipt. In addition, write and read descriptors 262 and 264 will only be accepted by the memory circuit 36 when q_ready 78 is asserted. Load descriptors 260 preferably are accepted at any time.

Figure 14:
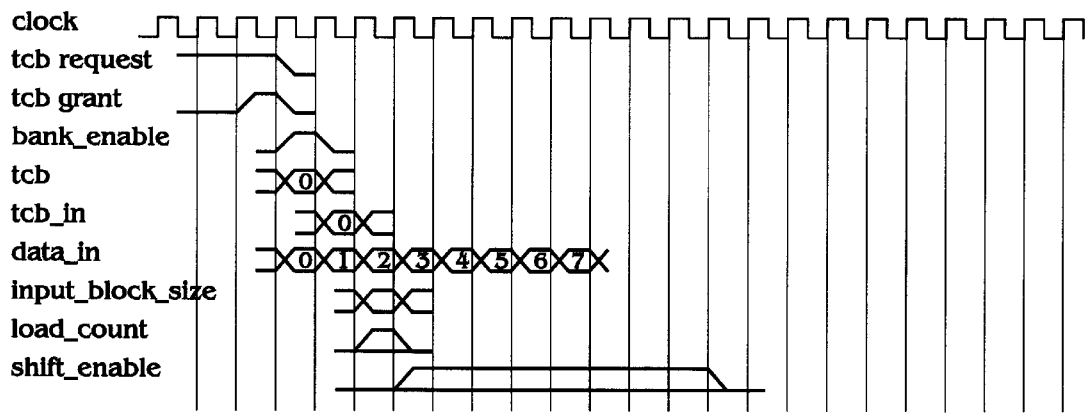
FIGS. 14 through 23 show timing diagrams of the operation of a memory circuit according to the present invention.
Figure 15:
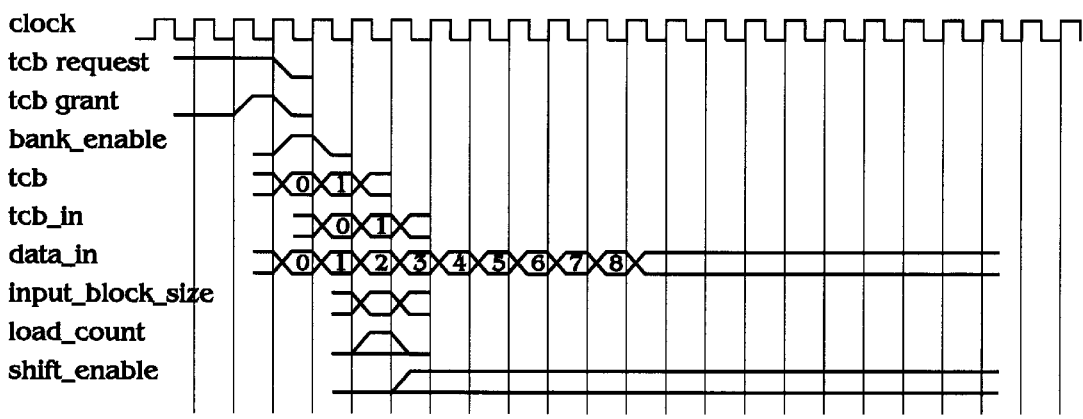
Figure 16:
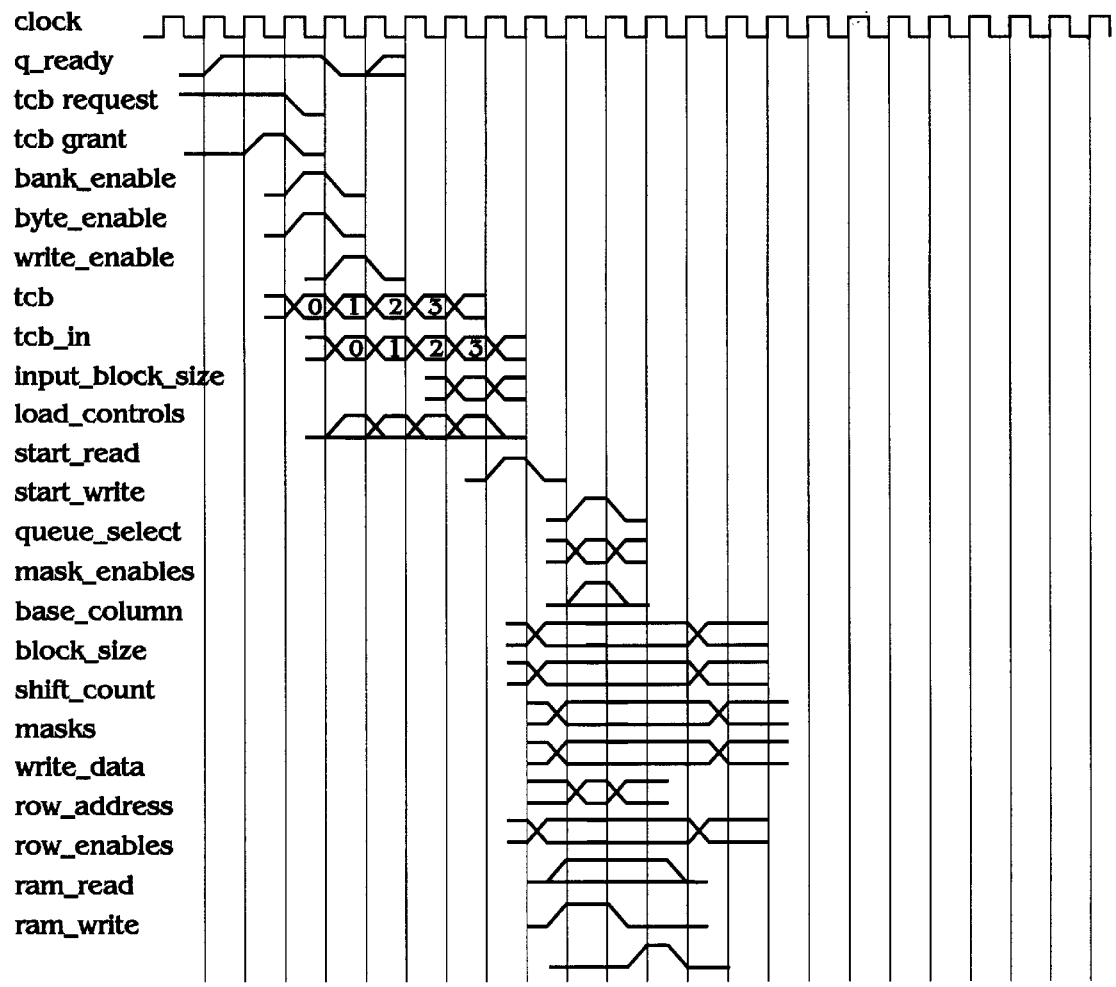
Figure 17:
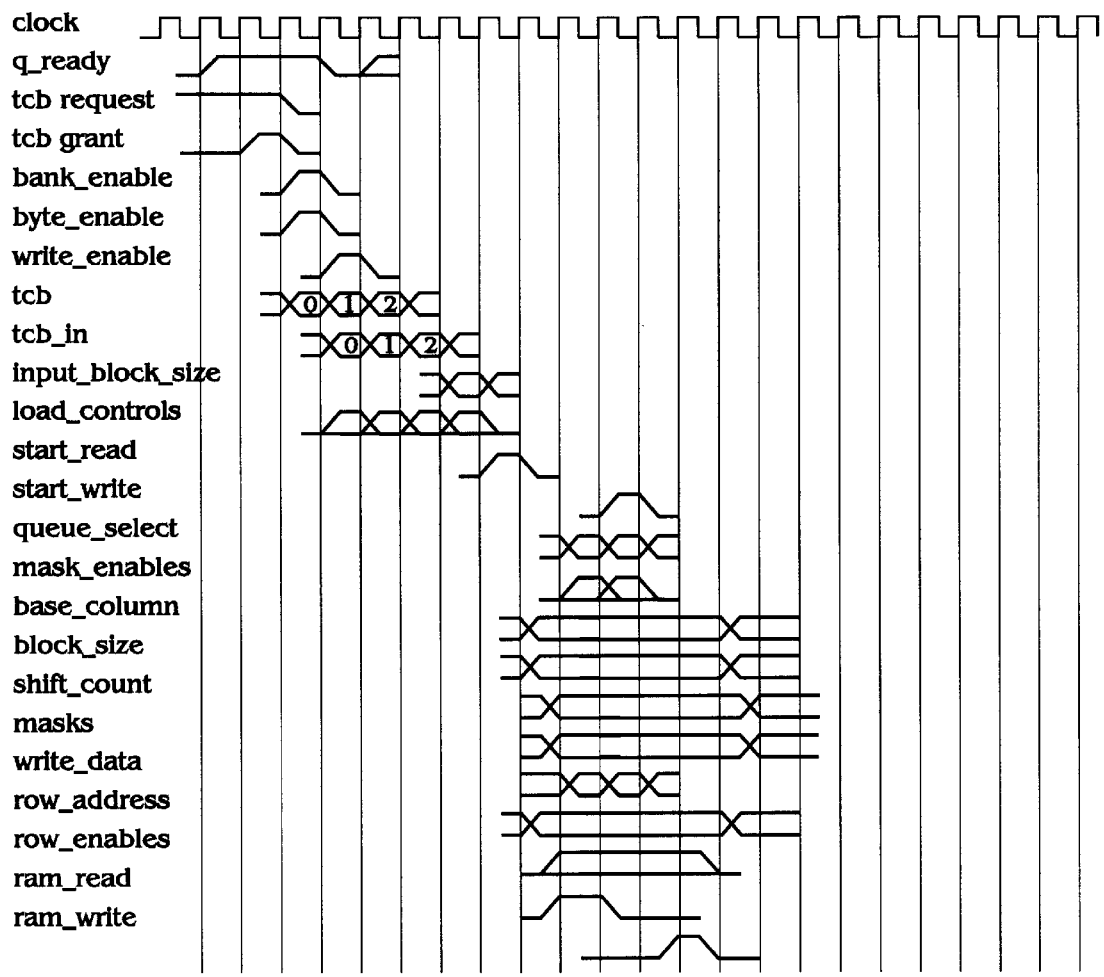
Figure 18:
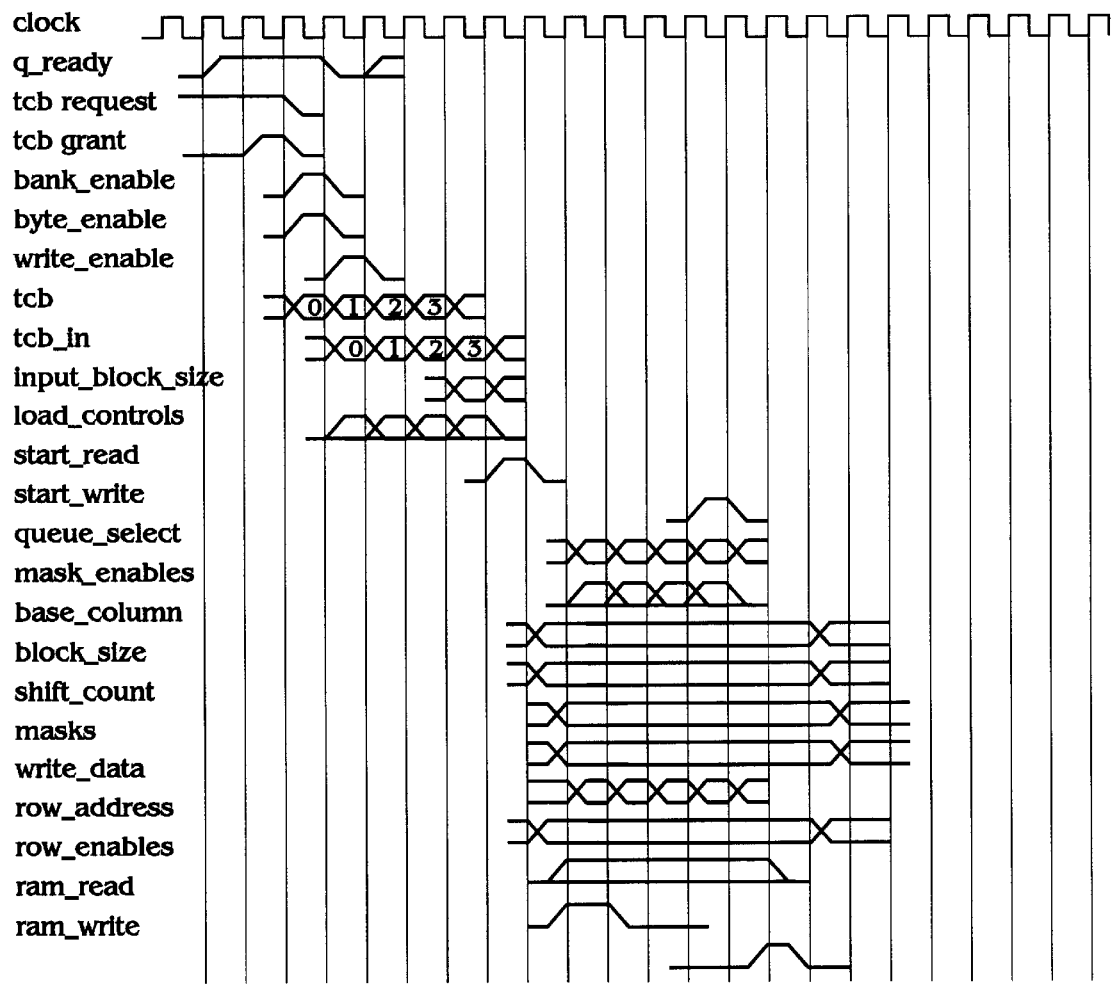
Figure 19:
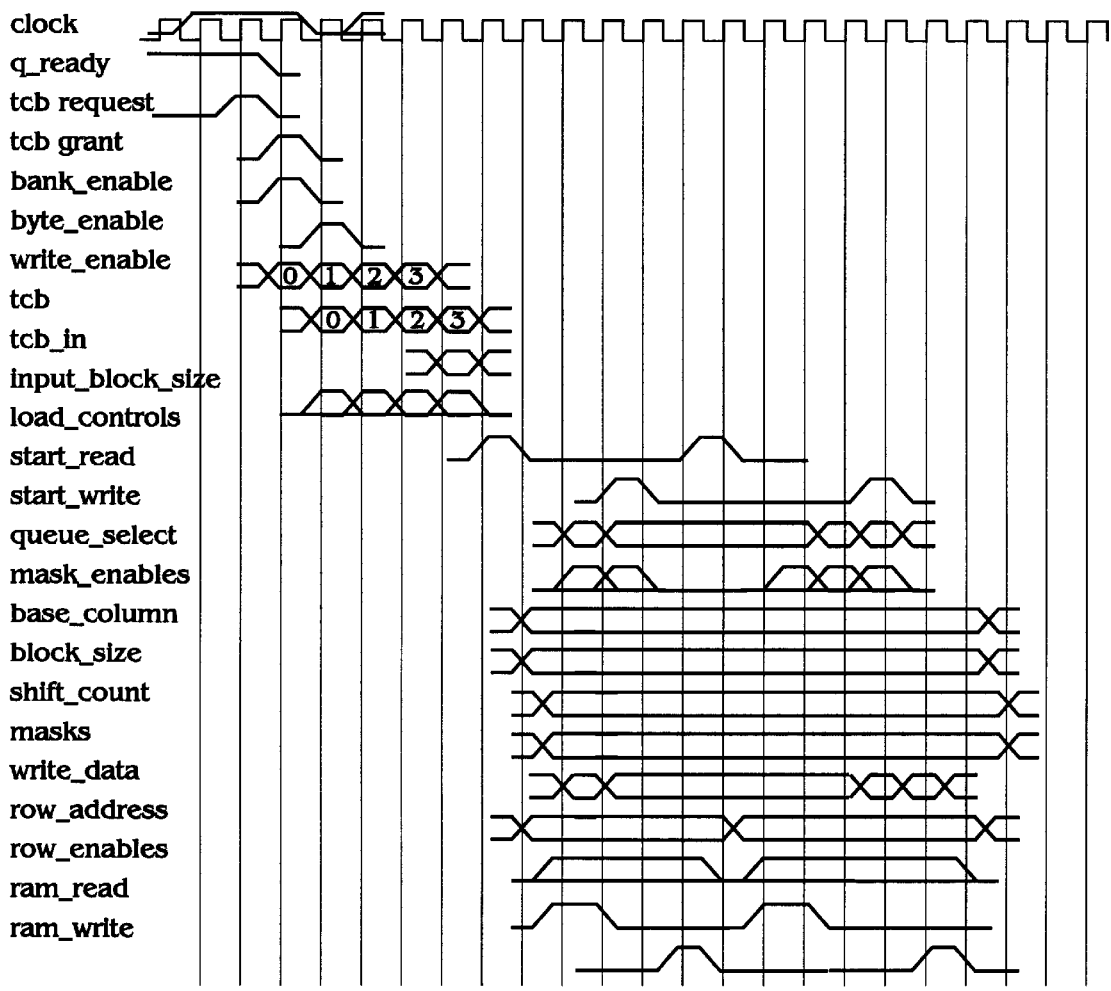
Figure 20:
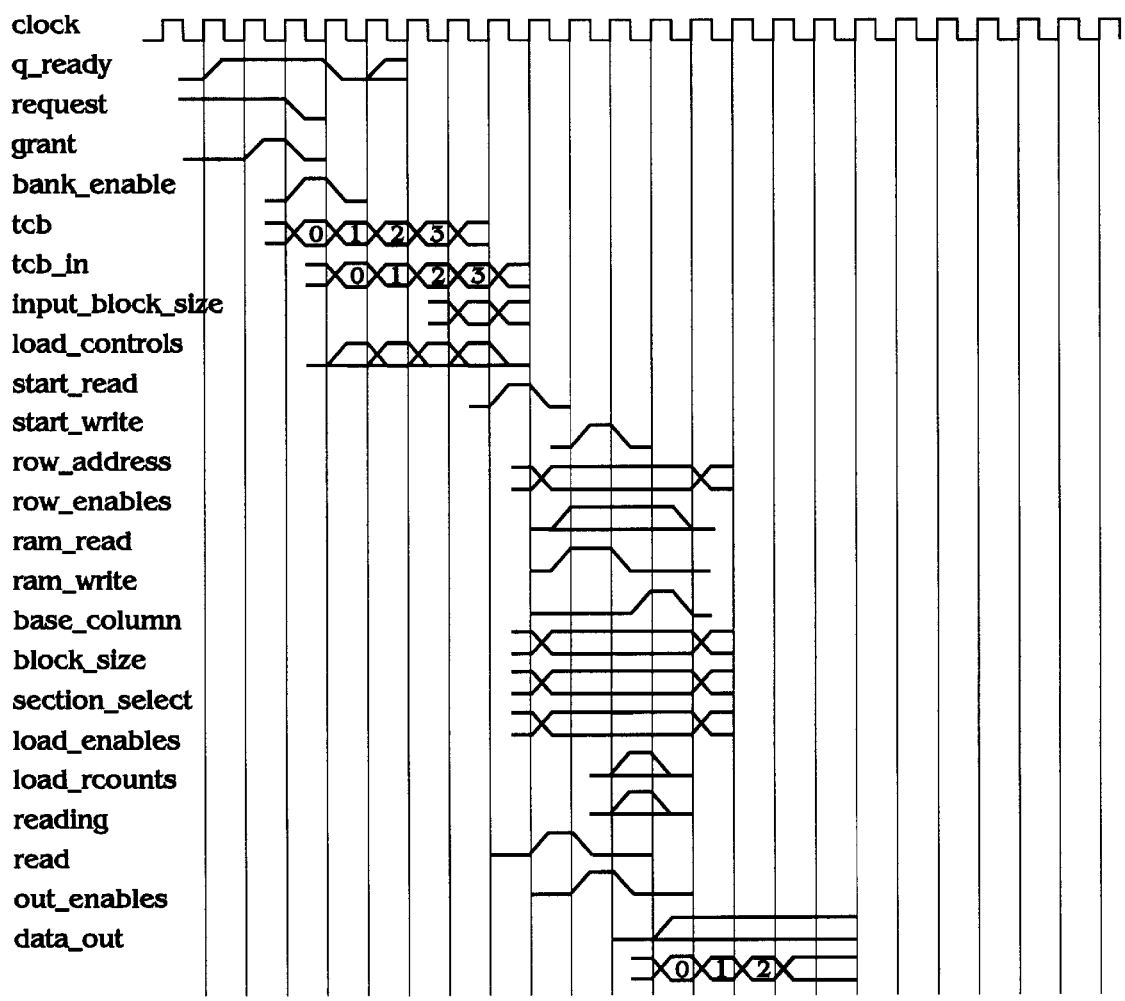
Figure 21:
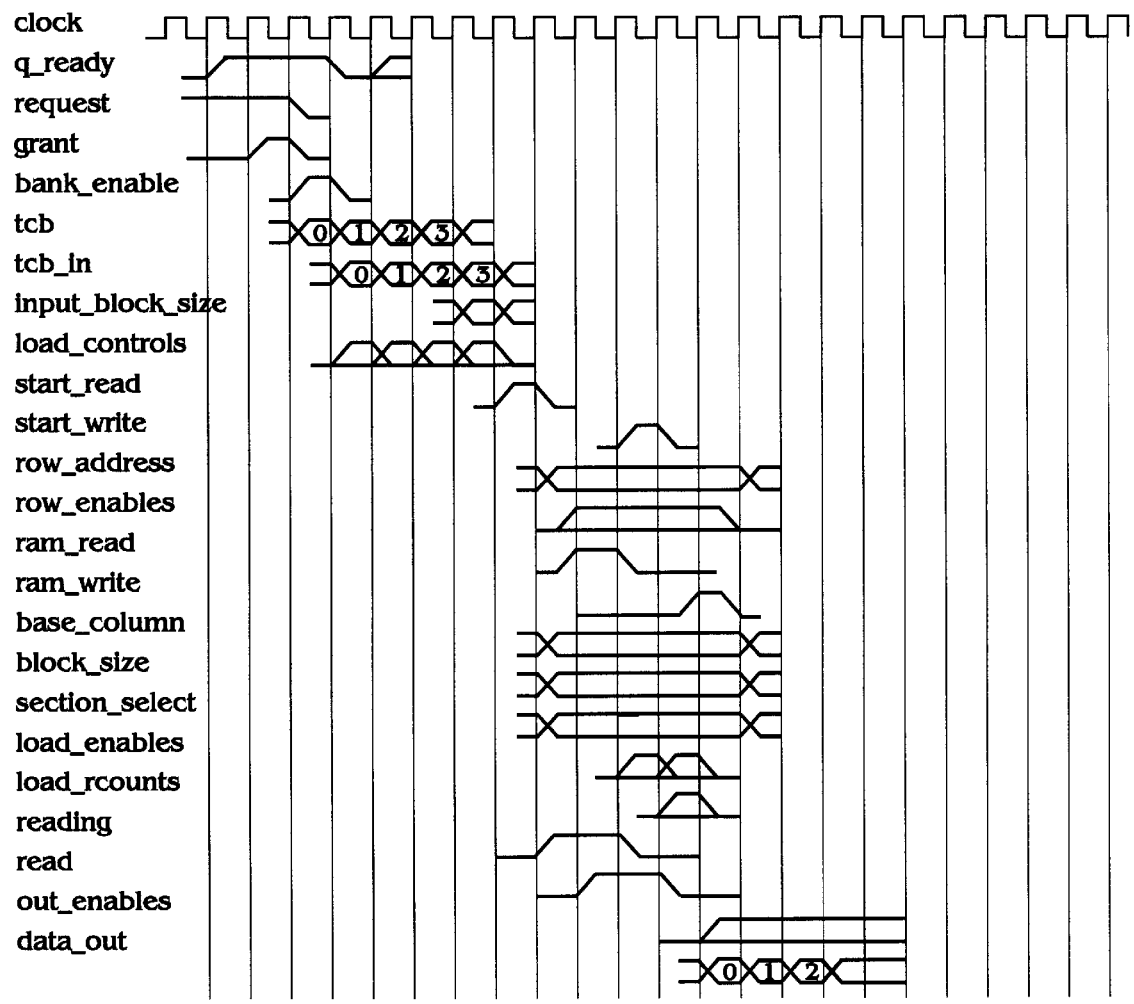
Figure 22:
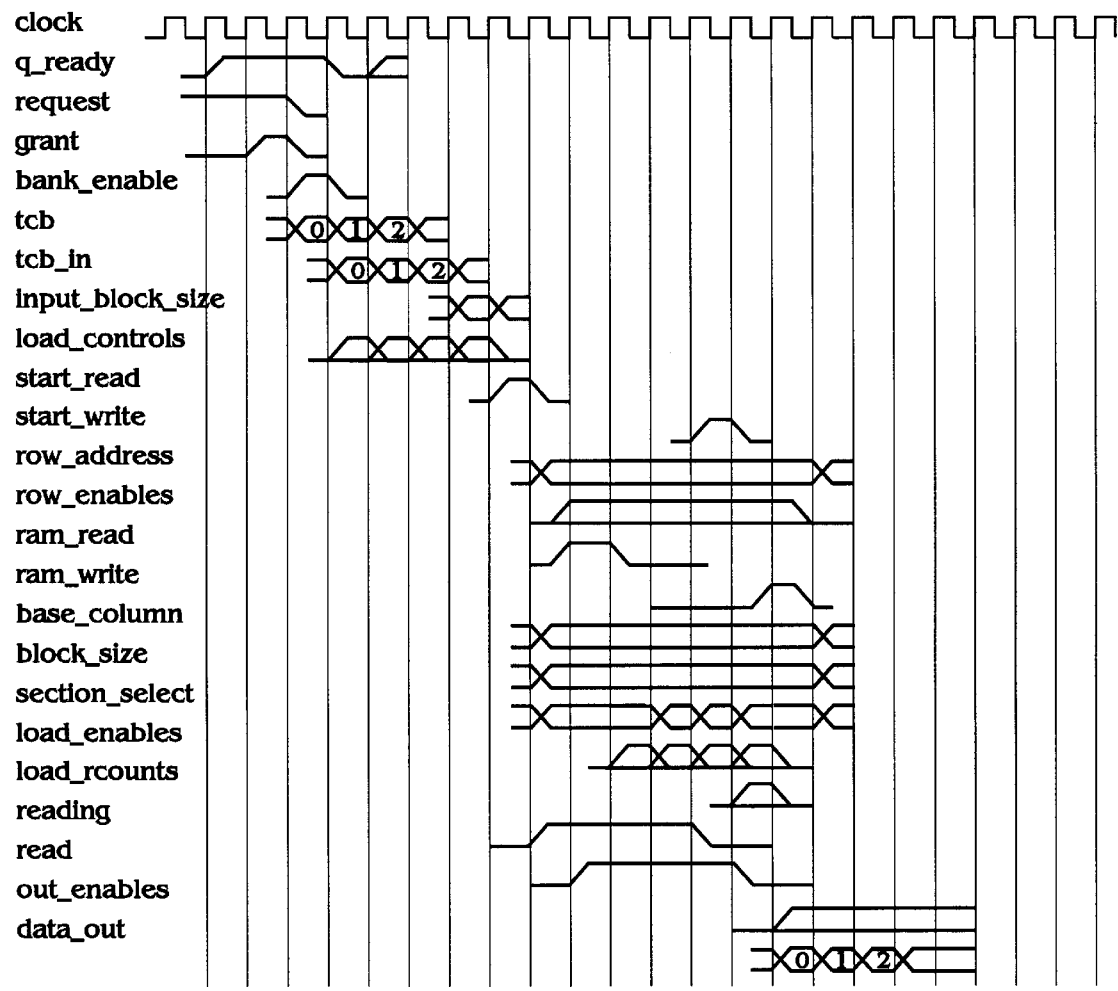
Figure 23:
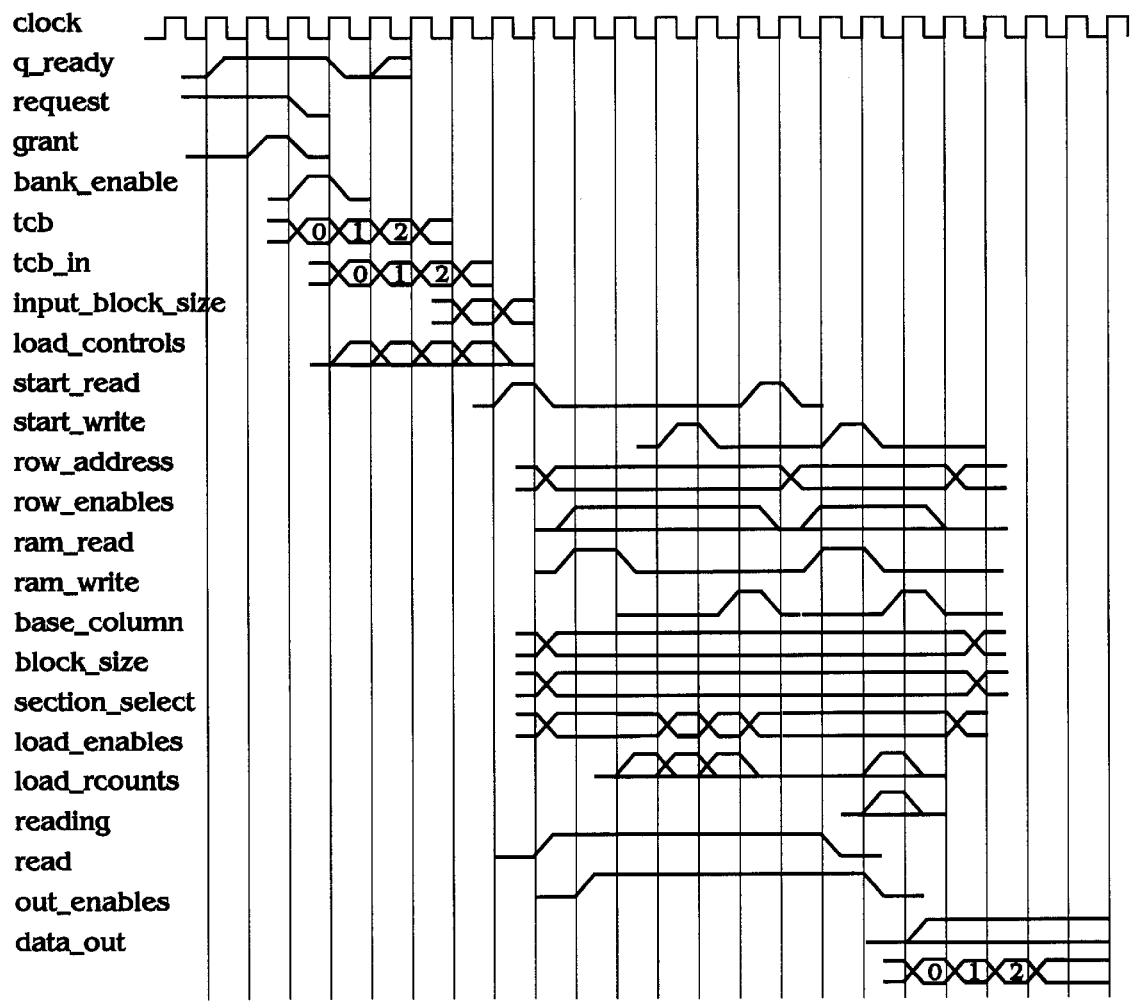

FIGS. 14 through 23 are timing diagrams further depicting the operation of the memory circuit 36. FIG. 14 shows the load timing for one port 18 writing a block of eight words to the in queue registers 52 using a one-cycle transaction descriptor. FIG. 15 shows the load timing for one port 18 writing a block of nine or more words to the in queue registers 52 using a two-cycle transaction descriptor. FIG. 16 shows an access of the RAM array 56 corresponding to a write descriptor for one port 18 in a memory circuit 36 having N ports 18, the descriptor being a four-cycle transaction descriptor. FIG. 17 shows an access of the RAM array 56 corresponding to a write descriptor for one port 18 in a memory circuit 36 having N/2 ports 18, the descriptor being a three-cycle transaction descriptor. FIG. 18 shows an access of the RAM array 56 corresponding to a write descriptor for one port 18 in a memory circuit 36 having N/4 ports 18, the descriptor being a four-cycle transaction descriptor. FIG. 19 shows an access of the RAM array 56 corresponding to a write descriptor for one port 18 in a memory circuit 36 having N/4 ports 18, the descriptor using a four-cycle transaction descriptor. The operations shown in FIG. 19 differs from those shown in FIG. 18 in that the access crosses a row boundary with the contents of the first in queue register 52 and of part of the second in queue register written to the end of the addressed row, while the contents of the other part of the second in queue register 52 and of the third and fourth in queue registers 52 are written at the beginning of the next consecutive row. FIG. 20 shows an access of the RAM array 56 corresponding to a read descriptor for one port of a memory circuit 36 having N ports 18, the descriptor being a four-cycle transaction descriptor. FIG. 21 shows an access of the RAM array 56 corresponding to a read descriptor for one port of a memory circuit 36 having N/2 ports 18, the descriptor being a four-cycle transaction descriptor. FIG. 22 shows an access of the RAM array 56 corresponding to a read descriptor for one port of a memory circuit 36 having N/4 ports 18, the descriptor being a three-cycle transaction descriptor. FIG. 23 shows a read access of the RAM array 56 corresponding to a read descriptor for one port of a memory circuit 36 having N ports 18, the descriptor being a four-cycle transaction descriptor. The operations shown in FIG. 23 differ from those shown in FIG. 22 in that the addressed data crosses a row boundary, with the data for the first, second and third out queue registers 64 being read from the end of the addressed row and the data for the fourth out queue register 64 being read from the beginning of the next consecutive row.

The memory circuit's control interface 24, in the above Figures, is shown to receive transaction descriptors from the transaction control bus 16 and, in response thereto, generates command and control signals for communication to the other elements of the memory circuit 36. The write access interface 26 provides buffered data paths for the flow of data into the RAM core 28. The interface, responsive to receipt of load descriptors 260, controls the flow of data into the in queue registers 52, the data from each input terminal 32 being loaded into a respective in queue register 52. The in queue registers 52 can be grouped in association with a respective port 18. The enqueued data is written to the RAM core 28 responsive to receipt of write descriptors. A single write descriptor 262 transfers all valid data to the RAM core 26 from the in queue registers 52 associated with the particular port 18 corresponding to the descriptor 262. In this transfer, the data is routed through the multiplexer 152 and the position shifter 154. These elements provide for writing the valid data into the RAM array 56 starting at any column of an addressed row. Thence, the memory circuit 36 provides for placing in the RAM array 56 a block of data, the size of the block being independently selectable and the placement of the block in the RAM array 56 starting at an independently selectable position. In addition, the memory circuit 36 provides for storing various blocks of data at independently selectable positions in the RAM array 56.

The memory circuit's read access interface 30 provides buffered data paths for the flow of data from the RAM core 28. Responsive to receipt of a read descriptor 264, data is read from the RAM array 56 in a complete row. Sections thereof are routed through the multiplexer 212 and the justify shifter 214 so that one or more complete or partial sections of valid data are selectable to comprise an output block. Block size is independently selectable from read descriptor to read descriptor. Each block of valid data is routed to the out queue registers 64, the placement of the blocks in the registers 64 being selectable. The out queue registers 64 can be grouped in association with a respective port 18. A single read descriptor 264 transfers all valid data associated with a port 18 corresponding to the descriptor 264 from the RAM array 56 to the one or more out queue registers 64 associated with that port 18. Because the valid data may be stored at independently selectable positions in the RAM array 56, it may be retrieved therefrom.

During the execution of the read descriptor 264, read 80 is asserted and deasserted and, thereafter, data is communicated at the respective output terminals 34. The system component 14 that issued the read descriptor 264 receives the data a fixed number of system clock cycles after the de-assertion of read 80.

The memory circuit 36 can be packaged in various ways, including having separate data input and output terminals 32 and 34 or having a single set of terminals that are shared for input and output. Separate input and output terminals 32 and 34 allow for full-duplex operation, while shared terminals allow for support of additional ports in a package of fixed pin count.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A digital electronic system enabling any of a plurality of components thereof to share a common main memory, said digital electronic system comprising:

a plurality of system components;

a common main memory having a plurality of data ports and a common address and control port;

a plurality of data circuits for interconnecting respective system components with corresponding data ports of said common main memory; and a common address and control circuit for interconnecting said plurality of system components with said common address and control port of said common main memory, said common address and control circuit enabling said plurality of system components to access said common main memory, any of said plurality of system components being able to monitor said common address and control port for address and control information issued by any other of said plurality of system components.

2. The digital electronic system of claim 1, wherein said plurality of system components are capable of temporarily storing, in respective internal cache memories, copies of data retrieved from said common main memory, and are able to participate collectively in maintaining the coherency of multiple copies of said data in said cache memories and said common main memory.

3. The digital electronic system of claim 2, wherein said plurality of system components are able to monitor said common address and control circuit for address and control information issued by any other of said plurality of system components, said address and control information enabling a system component, holding in its respective cache memory a copy of the addressed data, to maintain the status and coherency of its copy of said addressed data.

4. The digital electronic system of claim 3, wherein the combination of said common address and control circuit, said plurality of data circuits, and said common main memory further enable a system component, temporarily storing in its cache memory a modified copy of said addressed data, to provide its copy of said addressed data for updating the corresponding copy in said common main memory and completing the transaction requested by said system component that referenced said addressed data.

5. The digital electronic system of claim 4, wherein said combination of common address and control circuit, said plurality of data circuits, and said common main memory further enable said system component that referenced said addressed data to receive said modified copy of said addressed data, said modified copy of said addressed data being routed through said common main memory from source system component to destination system component.

6. The digital electronic system of claim 1, wherein said plurality of system components are capable of exchanging data through said plurality of data circuits and said common main memory, any of said plurality of system components being able to monitor said common address and control circuit for address and control information issued by any other of said plurality of system components, said address and control information enabling one or more destination system components to determine that data transmitted to said common main memory by a source system component, in conjunction with said address and control information, is destined for said one or more destination system components.

7. The digital electronic system of claim 6, wherein said address and control information further enable said one or more destination system components to determine the address, in said common main memory, from which said data can be retrieved.

8. The digital electronic system of claim 6, wherein said address and control information further enable said one or more destination system components to receive data routed through said common main memory, from source system component to destination system component.

9. The digital electronic system of claim 6, wherein said address and control information further enable said source system component to determine the address, in said common main memory, from which said data was retrieved by said one or more destination system components.

10. The digital electronic system of claim 9, wherein said address and control information further enabling said source system component to determine when data was retrieved by each of said one or more destination system components.

11. A method for enabling any of a plurality of components of a digital electronic system to share a common main memory, comprising:

providing the common main memory with a plurality of data ports and a common address and control port; and enabling said plurality of system components to access said common main memory so that any of said plurality of system components is able to monitor said common address and control port for address and control information issued by any other of said plurality of system components.

12. The method of claim 11, further comprising storing, in respective internal cache memories of said plurality of system components, copies of data retrieved from said common main memory, and causing said plurality of system components to participate collectively in maintaining the coherency of multiple copies of said data in said cache memories and said common main memory.

13. The method of claim 12, further comprising causing said plurality of system components to monitor said common address and control port for address and control information issued by any other of said plurality of system components so as to maintain the status and coherency of its copy of said addressed data.

14. The method of claim 13, further comprising enabling a system component, temporarily storing in its cache memory a modified copy of said addressed data, to provide its copy of said addressed data for updating the corresponding copy in said common main memory and completing the transaction requested by said system component that referenced said addressed data.

15. The method of claim 14, further comprising enabling said system component that referenced said addressed data to receive, through said common main memory, said modified copy of said addressed data.

16. The method of claim 11, further comprising enabling any of said plurality of system components to monitor said common address and control port for address and control information issued by any other of said plurality of system components, so as to determine that data transmitted to said common main memory by a source system component, in conjunction with said address and control information, is destined for one or more destination system components.

17. The method of claim 16, further comprising enabling said one or more destination system components to determine the address, in said common main memory, from which said data can be retrieved.

18. The method of claim 16, further comprising enabling said one or more destination system components to receive data routed through said common main memory, from source system component to destination system component.

19. The method of claim 16, further comprising enabling said source system component to determine the address, in said common main memory, from which said data was retrieved by said one or more destination system components.

20. The method of claim 19, further comprising enabling said source system component to determine when data was retrieved by each of said one or more destination system components.

* * * * *